(12) United States Patent
LeCrone et al.

(10) Patent No.: US 8,990,463 B1
(45) Date of Patent: Mar. 24, 2015

(54) TRANSFER OF DATA STORAGE DEVICE FEATURES

(71) Applicant: EMC Corporation, Hopkinton, MA (US)

(72) Inventors: Douglas E. LeCrone, Hopkinton, MA (US); Paul A. Linstead, Shrewsbury, MA (US); Denis J. Burt, Plymouth, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 14/139,931

(22) Filed: Dec. 24, 2013

Related U.S. Application Data

(63) Continuation of application No. 12/925,709, filed on Oct. 28, 2010, now Pat. No. 8,732,364.

(51) Int. Cl.
*G06F 3/00* (2006.01)
*G06F 13/00* (2006.01)
*G06F 13/38* (2006.01)
*G06F 17/50* (2006.01)

(52) U.S. Cl.
CPC .................................. *G06F 17/5009* (2013.01)
USPC .................................. 710/74; 710/33; 710/15

(58) Field of Classification Search
None
See application file for complete search history.

(56) References Cited

U.S. PATENT DOCUMENTS

2010/0265608 A1* 10/2010 Lee et al. ......................... 360/31
2010/0318501 A1* 12/2010 Alaimo et al. ................ 707/694

* cited by examiner

*Primary Examiner* — Zachary K Huson
(74) *Attorney, Agent, or Firm* — Muirhead and Saturnelli, LLC

(57) ABSTRACT

Transferring storage device functionality includes providing a device coupled to the storage device, where the device is separate from the storage device, having the device handle I/O requests between an application and the storage device, and, in response to the application issuing an I/O request, having the device determine if the request corresponds to functionality being transferred and, if so, having the device provide the functionality. The device may be a host computer. The application may run on the host computer. A driver on the host computer may provide the functionality. The functionality may include read only functionality, data compression, data encryption, mirroring, and/or status reporting.

16 Claims, 26 Drawing Sheets

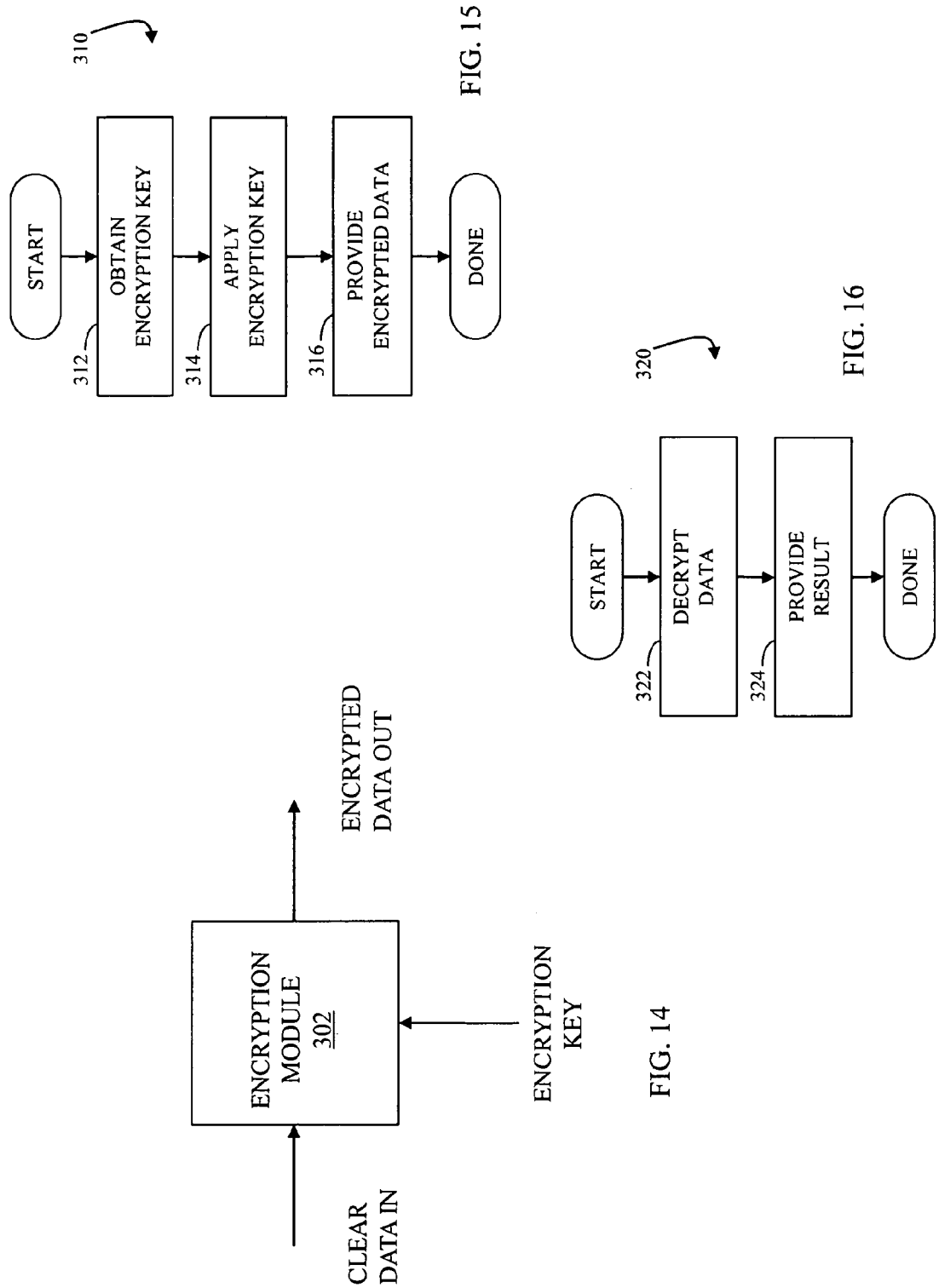

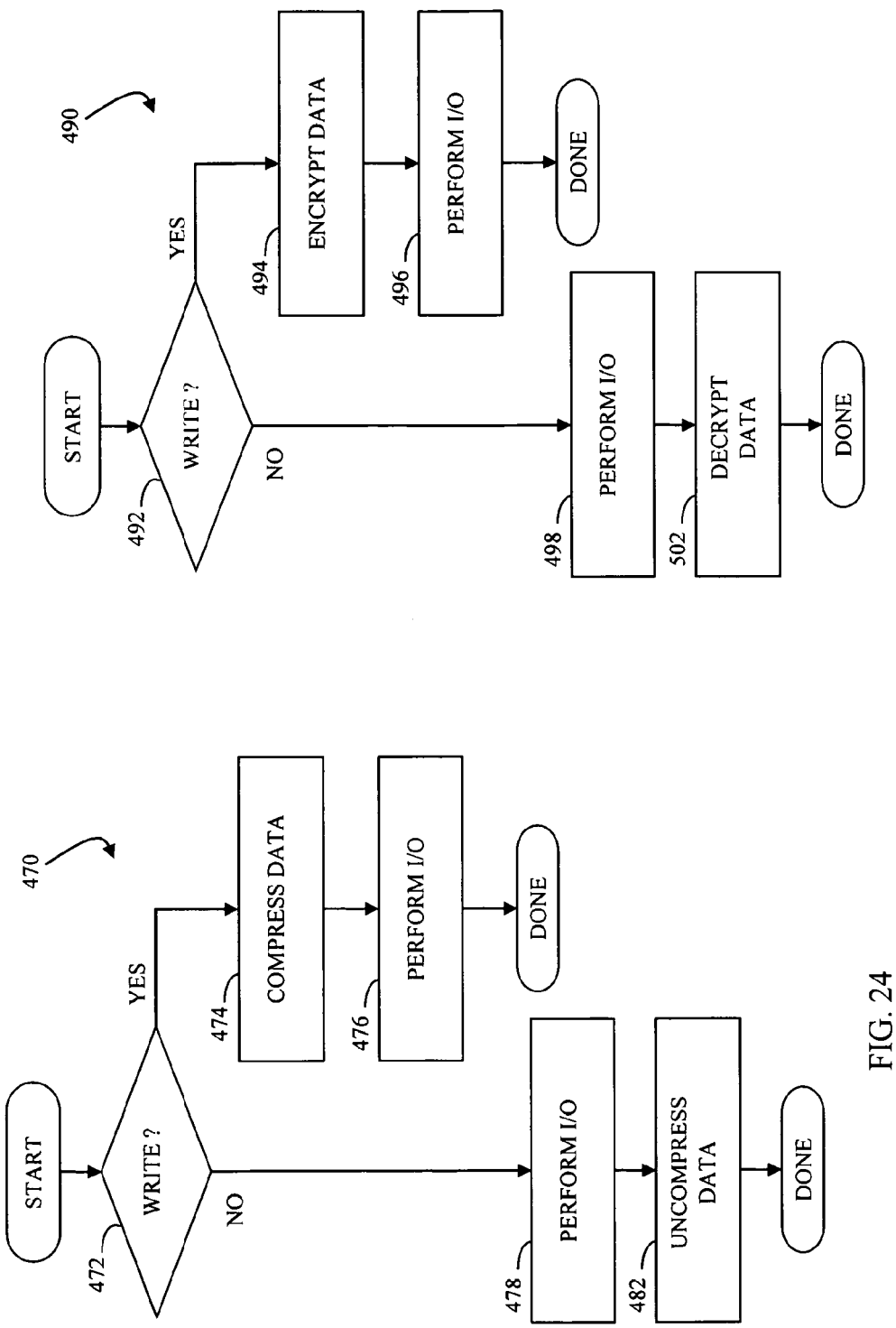

TRANSFER OF DATA STORAGE DEVICE FEATURES

RELATED APPLICATIONS

This application is a continuation of U.S. patent application Ser. No. 12/925,709 (pending), filed on Oct. 8, 2010, entitled TRANSFER OF DATA STORAGE DEVICE FEATURES which is incorporated by reference herein.

BACKGROUND OF THE INVENTION

1. Field of the Invention

This system described herein relates to data storage facilities and more specifically to the field of transferring the functionality of data storage facilities.

2. Description of Related Art

Host processor systems may store and retrieve data using a storage device containing a plurality of host interface units (host adapters), disk drives, and disk interface units (disk adapters). Such storage devices are provided, for example, by EMC Corporation of Hopkinton, Mass. and disclosed in U.S. Pat. No. 5,206,939 to Yanai et al., U.S. Pat. No. 5,778,394 to Galtzur et al., U.S. Pat. No. 5,845,147 to Vishlitzky et al., and U.S. Pat. No. 5,857,208 to Ofek. The host systems access the storage device through a plurality of channels provided therewith. Host systems provide data and access control information through the channels to the storage device and the storage device provides data to the host systems also through the channels. The host systems do not address the disk drives of the storage device directly, but rather, access what appears to the host systems as a plurality of logical disk units. The logical disk units may or may not correspond to the actual disk drives. Allowing multiple host systems to access the single storage device unit allows the host systems to share data stored therein.

In some instances, it may be desirable to copy data from one storage device to another. For example, if a host writes data to a first storage device, it may be desirable to copy that data to a second storage device provided in a different location so that if a disaster occurs that renders the first storage device inoperable, the host (or another host) may resume operation using the data of the second storage device. Such a capability is provided, for example, by the Remote Data Facility (RDF) product provided by EMC Corporation of Hopkinton, Mass. With RDF, a first storage device, denoted the "primary storage device" (or "R1") is coupled to the host. One or more other storage devices, called "secondary storage devices" (or "R2") receive copies of the data that is written to the primary storage device by the host. The host interacts directly with the primary storage device, but any data changes made to the primary storage device are automatically provided to the one or more secondary storage devices using RDF. The primary and secondary storage devices may be connected by a data link, such as an ESCON link, a Fibre Channel link, and/or a Gigabit Ethernet link. The RDF functionality may be facilitated with an RDF adapter (RA) provided at each of the storage devices.

RDF may be used to provide for disaster recovery, whereby one or more R2 devices are provided in remote site(s) along with remote host device(s). The R1 storage device(s) are provided at a primary site with one or more host(s) that perform the work for the system. When a failure occurs at a primary site, the work performed using the R1 device may be transparently shifted to the R2 storage device at a remote site. In such a case, the R2 device, which had been read only prior to the failure, becomes a writeable R2 device (and/or becomes an R1 device) that is usable by the host.

In some cases, the system may be designed/configured to rely on the R2 device(s) at remote site(s) being read only. For example, the data written at the primary site may be financial information that should only be writeable by a relatively secure host at the primary site even though it is readable by less secure host(s) at the remote site(s). After a failover occurs and the previously read only remote storage device(s) become writeable, it may be unacceptable to have the (less secure) remote host(s) be able to write data thereto. Note also that, even in instances where the remote host(s) do not actually write any data, the fact that the host(s) have write access may still be problematic (e.g., in situations where it is necessary to prove compliance to data handling regulations).

Accordingly, it is desirable to provide a system that addresses the issues set forth above.

SUMMARY OF THE INVENTION

According to the system described herein, transferring storage device functionality includes providing a device coupled to the storage device, where the device is separate from the storage device, having the device handle I/O requests between an application and the storage device, and, in response to the application issuing an I/O request, having the device determine if the request corresponds to functionality being transferred and, if so, having the device provide the functionality. The device may be a host computer. The application may run on the host computer. A driver on the host computer may provide the functionality. The functionality may include read only functionality, data compression, data encryption, mirroring, and/or status reporting. For each particular functionality provided by the device, the device may return to the application a response corresponding to a response provided by the storage device in connection with the storage device providing the particular functionality.

According further to the system described herein, simulating read only functionality of a storage device includes providing a device coupled to the storage device, where the device is separate from the storage device and where the storage device services read and write requests, having the device handle I/O requests between an application and the storage device, in response to the application issuing a write request, the device denying the request by providing a response to the application corresponding to a response provided by the storage device in connection with the storage device having read only functionality, where the device does not provide the write request to the storage device, and, in response to the application issuing a read request, passing the read request on to the storage device. The device may be a host computer. The application may run on the host computer. A driver on the host computer may deny the request and pass the request on to the storage device.

According further to the system described herein, computer software that handles particular storage device functionality. The software is provided in a non-transitory computer readable medium of a device that is separate from the storage device. The software includes executable code that handles I/O requests between an application and the storage device, executable code that determines if a request corresponds to functionality being transferred, and executable code that provides the particular functionality and returns a result to the application in response to the application issuing an I/O request for particular functionality. The device may be a host computer. The application may run on the host computer. A driver on the host computer may provide the functionality. The functionality may include at least one of: read only functionality, data compression, data encryption, mirroring, and status reporting. The computer software may also include executable code that returns to the application a response corresponding to a response provided by the storage device in connection with the storage device providing the particular functionality.

BRIEF DESCRIPTION OF THE DRAWINGS

Embodiments of the system are described with reference to the several figures of the drawings, noted as follows.

FIG. 14 illustrates an embodiment of an encryption module according to the system described herein.

FIG. 15 is a flow chart that illustrates steps performed in connection with data migration when data migration is coupled with encryption as described herein.

FIG. 16 is a flow chart that illustrates steps that may be performed in connection with decrypting data according to the system described herein.

FIG. 24 is a flow chart illustrating processing perform in connection with simulating storage device data compression functionality according to an embodiment of the system described herein.

FIG. 25 is a flow chart illustrating processing perform in connection with simulating storage device encryption functionality according to an embodiment of the system described herein.

DESCRIPTION OF ILLUSTRATIVE EMBODIMENTS

Figure 1:
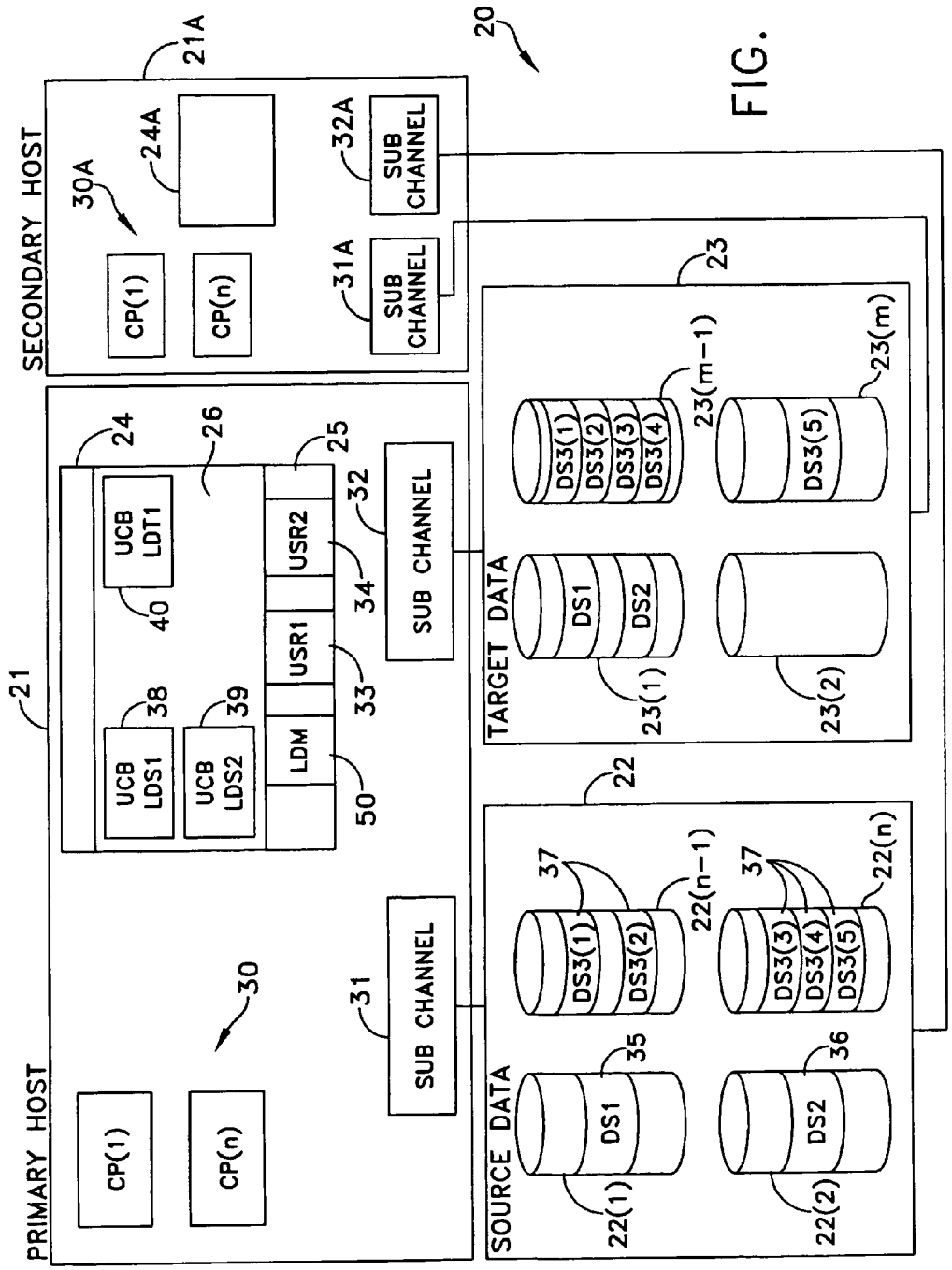
FIG. 1 is a block diagram of a multiple host data processing system that can benefit from the system described herein and that includes multiple data storage facilities.

FIG. 1 depicts, as an example, a data processing system 20 that includes a host 21 and two disk array storage devices as data storage facilities 22 and 23. As known in the art, the host 21 includes a main memory 24 divided into at least one private area 25 and a common storage area 26. One or more processors 30 interact with the memory 24.

Communications between the single host 21 and input-output devices, such as the data storage facilities 22 and 23, occur through sub-channels. A sub-channel 31 interfaces the host 21 and the source data storage facility 22; a sub-channel 32, the target data storage facility 23. The secondary host 21A has a similar construction with multiple processors 30A, a memory 24A and sub-channels 31A and 32A.

As previously described, a host application and a data storage facility identify the location of data differently. That is, host applications view data at a logical level as data extents or "extents" and/or data sets of one or more extents. The operating system, such as the MVS operating system (z/OS), converts the host addressing format for the data into an addressing format for the data storage facility.

More specifically, the operating system uses an access method as an interface between the host application and low level routines, like the EXCP, media manager and I/O device routines. The I/O driver routines call low level functions, such as a STARTIO function to initiate I/O through a subchannel thereby to pass information to and from the data storage facility. The operating system uses information from an integrated catalog facility (ICF) that contains, among other things, the Catalog, VTOC, VVDS and other components well known in the art, to translate a data address from the addressing format received from an application into the addressing format that identifies the data by a logical device, cylinder and head. This information is generally called "metadata". The data storage facility includes information for changing this logical device addressing format to the physical disk drive addressing format.

By way of example, assume that the data storage facility 22 in FIG. 1 is an existing, or source, data storage facility and that the data storage facility 23 is either a new or a preexisting data storage facility that is to act as a target to receive data from the source data storage facility 22. The data storage facility 22 has "n" logical devices with logical devices 22(1), 22(2), 22(n−1) and 22(n) being shown in FIG. 1. The data storage facility 23 has "m" logical devices with logical devices 23(1), 23(2), 23(m−1) and 23(m) being shown. In the following discussion the logical devices in the data storage facility 22 are called "source logical devices"; the logical devices in the data storage facility 23, "target logical devices."

The host 21 in FIG. 1 represents a typical mainframe system with multiple processing units controlled by an operating system, such as an IBM mainframe system operating with the IBM MVS operating system. In such a host, user applications provide the control for manipulating useful data. A USR1 application 33 and a USR2 application 34 represent two such user applications. For example, the USR1 application 33 might handle transaction processing; the USR2 application 34 might generate reports based upon the data supplied through the USR1 application 33. Often applications such as the USR1 application 33 must be available 24 hours per day, 7 days a week. Report applications may run periodically.

As known, extents forming a data set may be stored in any number of ways. That is, extents in one data set may be contiguous or non-contiguous. For example, assume that the USR1 application 33 and USR2 application 34 interact with three separate data sets designated as a DS1 data set 35, a DS2 data set 36 and a DS3 data set 37 in the source data storage facility 22. For purposes of explanation, assume that all the extents in the DS1 and DS2 data sets 35 and 36 are contiguous and that each data set resides in one logical device. Assume that the DS3 data set 37 has five extents with two extents, DS3(1) and DS3(2) residing non-contiguously on source logical device 22(n−1), while extents DS(3), DS(4) and DS(5) reside contiguously on source logical device 22(n).

The system described herein has the capability of migrating data sets with contiguous extents, non-contiguous extents or a combination thereof. With reference to the specific embodiment of FIG. 1, the system described herein has the capability of migrating each of the disclosed data sets from the source logical devices 22(1), 22(2), 22(n−1) and 22(n) to target logical devices in the data storage facility 23 without interrupting any interaction between the user applications 33 and 34 and the data in the DS1, DS2 and DS3 data sets 35, 36 and 37. For example, both the DS1 and DS2 data sets 35 and 36 can migrate to one logical device, such as the target logical device 23(1). FIG. 1 also depicts an operation by which four extents of the DS3 data set 37 migrate to contiguous locations in the target logical device 23(m−1) while the fifth extent DS3(5) migrates to the target logical device 23(m).

The memory 24 in FIG. 1 contains a Unit Control Block (UCB) for each of the logical devices in both the data storage facilities 22 and 23. These unit control blocks are stored in the common area 26 of the memory 24. FIG. 1, by way of example, depicts a UCB LDS1 control block 38 associated with the source logical device 22(1) that contains the DS1 data set 35. A UCB LDS2 unit control block 39 is associated with the source logical device 22(2). A UCB LDT1 unit control block 40 is associated with the target logical device 23(1). Other unit control blocks, not shown, are associated with each of the other logical devices shown in FIG. 1.

Figure 2:
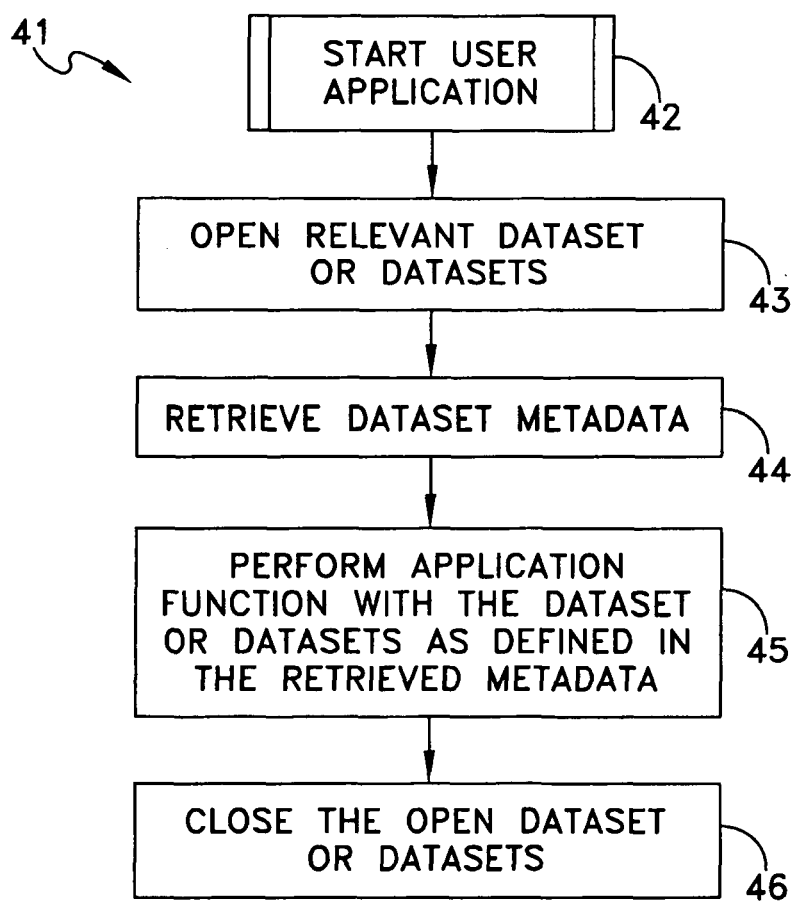
FIG. 2 is a flow chart that depicts a typical prior art interaction between an application and a data set.

It may be helpful to review the basic operating steps of a user application as shown by the sequence 41 in FIG. 2. When a user application, such as the USR2 application 34, is initialized, step 42 performs certain preliminary functions that are not relevant to the system described herein. Then step 43 opens one or more relevant data sets. For example, the USR1 application 33 could open the DS1 and DS3 data sets 35 and 37 while the USR2 application 34 could open the DS2 data set 36. In part of that process the USR1 and USR2 applications 33 and 34 retrieve the corresponding data set metadata in step 44. The metadata includes MVS catalog information that provides a volume serial number which the system maps to a particular logical device and UCB at any point in time. The VTOC provides the extent list with a set of cylinder and head ranges.

Step 45 performs the application function using the metadata it has retrieved for controlling I/O requests with various input-output units including, for example, the data storage facility 22 in FIG. 1, and particularly the DS1 data set 35, the DS2 data set 36, and the DS3 data set 37. Moreover, each application that opens a data set to be migrated continues to use the original metadata for that data set until the application closes that data set. That is, when an application terminates, step 46 closes any open data set or data sets that the application opened in step 43. However, when one application closes a data set, it is possible for that data set to still be opened to another application. An understanding of this process is important because when an application closes a data set after a migration occurs, the application accesses the migrated data on a target logical device directly when the application subsequently opens the data set.

Logical Data Migration

Command

In many situations a set of configuration statements control the operation of control applications. In some control applications, a set of one or more configuration statements may initiate different phases of the control application. Different configuration statement sets may enable the commencement of initialization, migration and diversion, and termination phases. It is within the skill of those in the art to generate the necessary configuration statements with knowledge of the function of the control application and the specific configuration of the data processing system.

For purposes of this explanation, a "command" represents a set of configuration statements and describes the information related to the system described herein to enable a person to prepare the necessary configuration statements. A given command will be considered to have the capability of controlling the commencement of a single phase or multiple phases in sequence. Also each phase will be considered to be implemented as a module for performing that specific phase.

Figure 3:
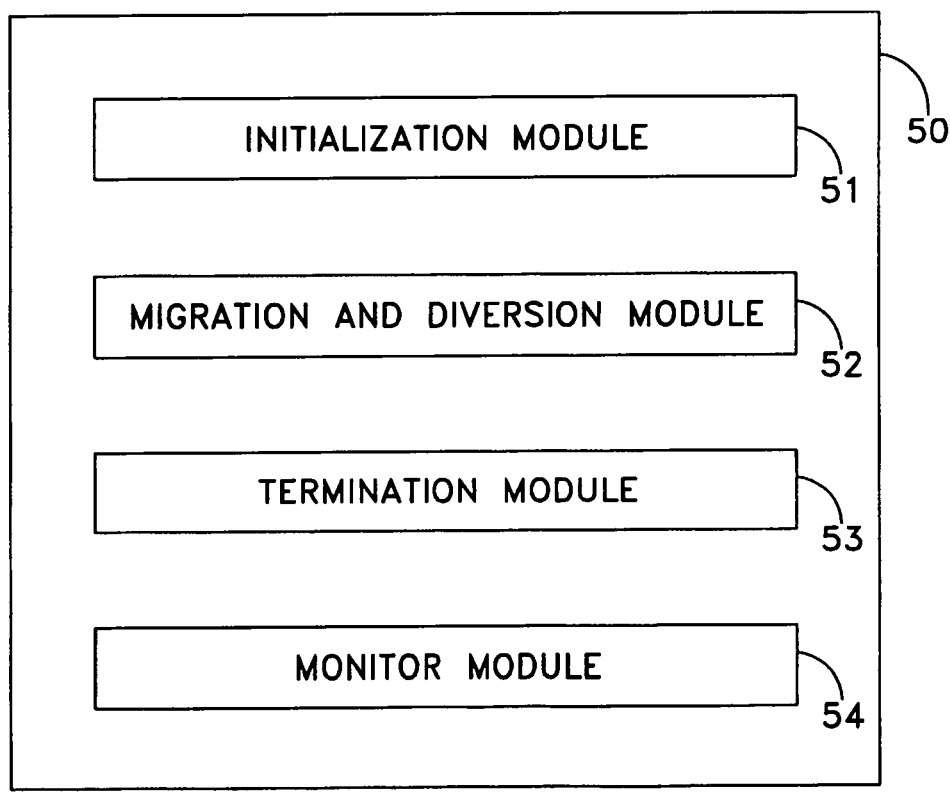
FIG. 3 is a block diagram of the organization of a logical migration application that operates in accordance with the system described herein.

With this background, FIGS. 1 and 3 depict one example of a Logical Device Migration (LDM) application 50 that can be characterized as migrating one or more data sets from a plurality of extents in one or more source logical devices to one or more target logical devices. The specific LDM logical application may be expressed as having four separate operating modules, each representing a specific function or related group of functions. These include an initialization module 51, a migration and diversion module 52, a termination module 53 and a monitor module 54.

When the LDM application 50 is loaded into the memory 24, as in the private application memory 25, it enables the processor 21 to respond to an LDM command that has information in the form of arguments or fields. Basically the command will include the following information:

1. A command identifier, such as "LDM" or an equivalent operation code, which identifies the command as a logical data migration command.
2. Arguments identifying the modules of FIG. 3 to be executed in response to the command. For example, these could include an initialization argument, a migration-and-diversion argument, a termination argument, a monitor argument, or some combination of some or all of those arguments;
3. An identification of the source data sets that will be identified by name, either specifically or via pattern matching, and/or by identifying the various source volumes. Identification of the target logical devices will be made either specifically or via rules such as those used by IBM's Storage Management System, i.e., the so-called Storage Group, or similar facility. There are a variety of ways known in the art to identify data groups, sets and extents in a data storage facility;
4. A threshold argument that establishes the number of cylinders or tracks below which the remaining tracks are copied with application I/O quiesced to establish full synchronization and a mirrored state;
5. When data sets are organized in data groups, an argument can determine whether the group migration is to occur in a consistent manner; and
6. In a multi-host network, such as shown in FIG. 1 formed with another host 21A, whether the host is a primary, or owner, host or a secondary, or non-owner, host.

Figure 4:
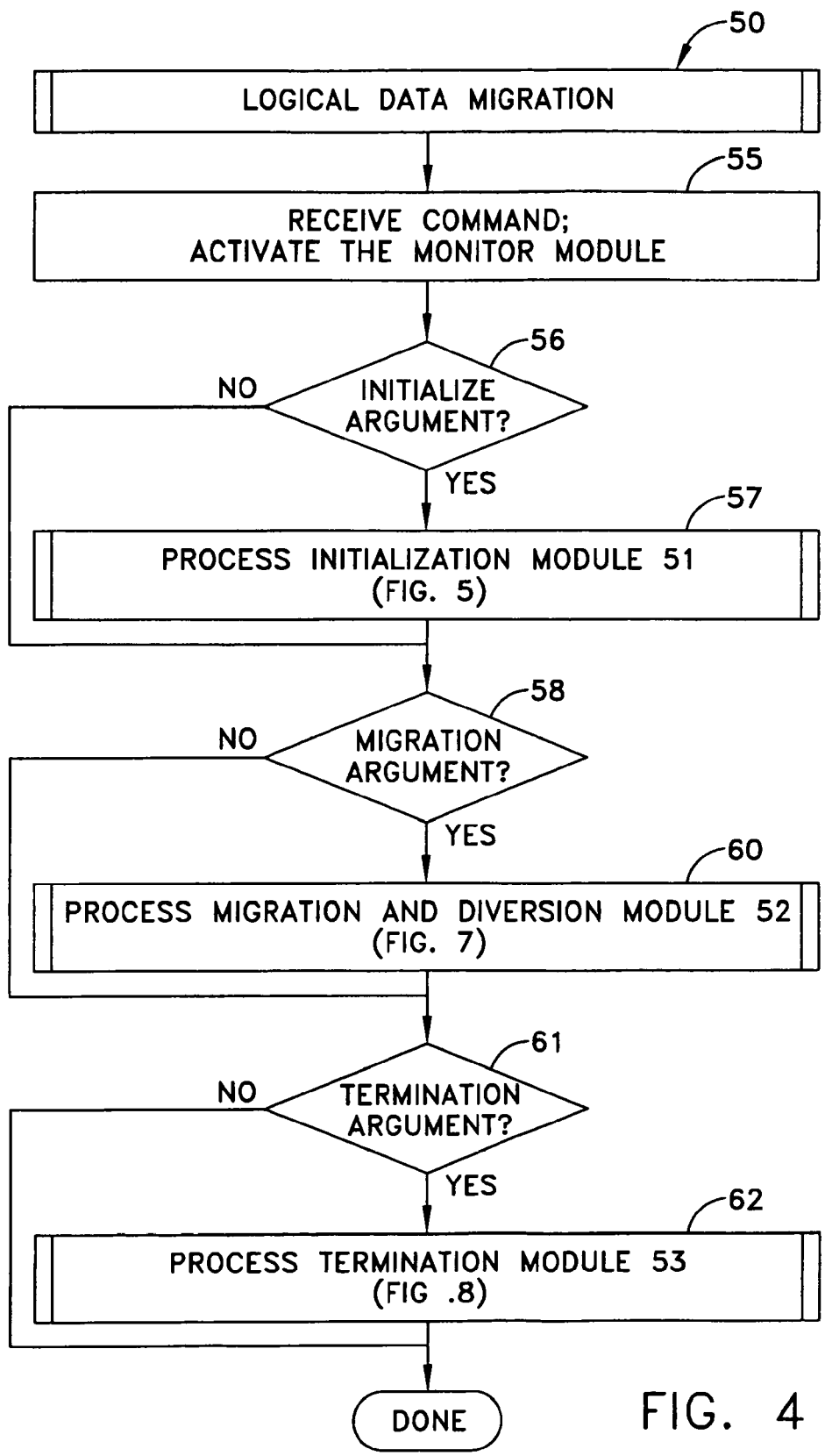
FIG. 4 is a flow diagram that depicts the operation of the logical migration application in response to a command.
Figure 11:
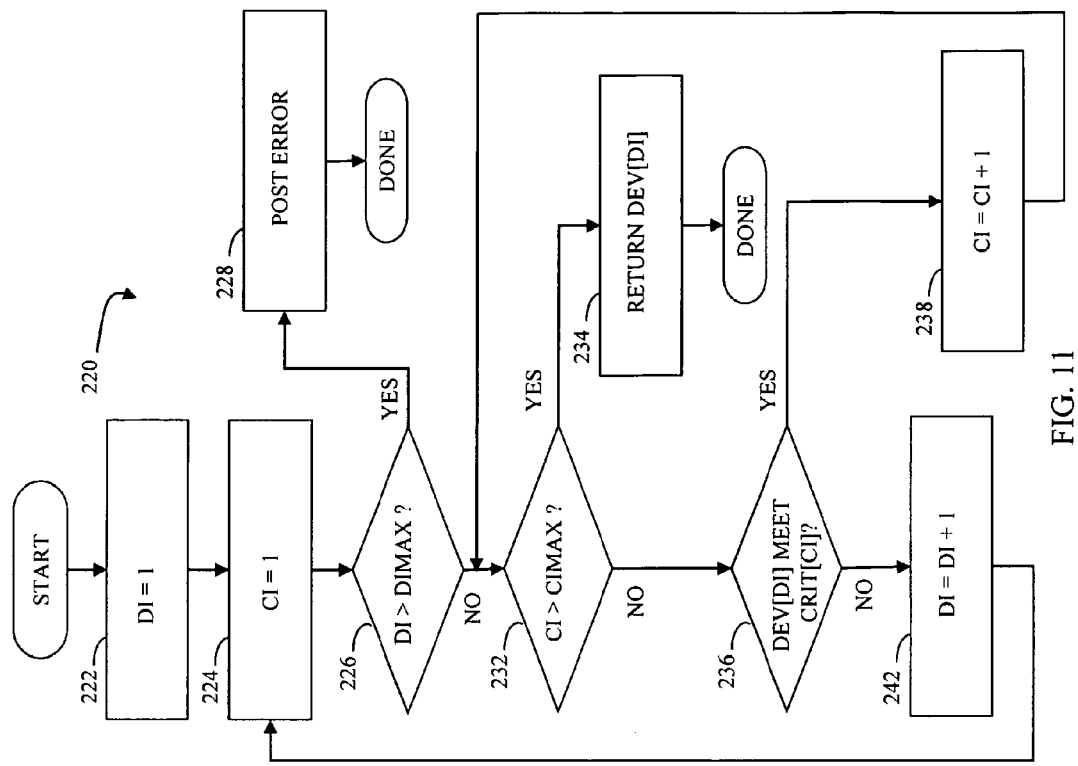
FIG. 11 is a flow diagram illustrating selection of a target logical device for data set migration.

Once the logical data migration application is loaded and activated, the execution of an LDM or equivalent command will initiate any of a variety of operations or sequences as depicted in FIG. 4. For example, step 55 represents the receipt of the command and activation of the monitor module 54 for transactions between that host and any extent to be migrated in response to the LDM command. Step 56 and 57 process the initialization module 51 according to FIG. 5 in response to a valid argument. If the migration-and-diversion argument is valid, step 58 enables step 60 to process the migration and diversion module 52 in accordance with the steps shown in FIGS. 7 through 10 that migrate the data. If the termination argument is valid, step 61 enables step 62 to process the termination module as shown in FIG. 11. This particular implementation would enable all the procedures shown in FIG. 3 to be processed in sequence in response to one command. However, as will become apparent, a first command typically may include only a valid initialization argument or both a valid initialization argument and a migration and diversion argument. Some time later an LDM command would be issued with only a valid termination argument.

Logical Data Migration

Initialization Phase

When an LDM command with the initialization argument is received, the LDM application 50 utilizes the initialization module 51 to generate control data structures that identify the location of the extents in the source logical device and locations in the target storage logical device for each extent to be migrated. The initialization module also stores configuration information related to the source and target logical devices.

Figure 5:
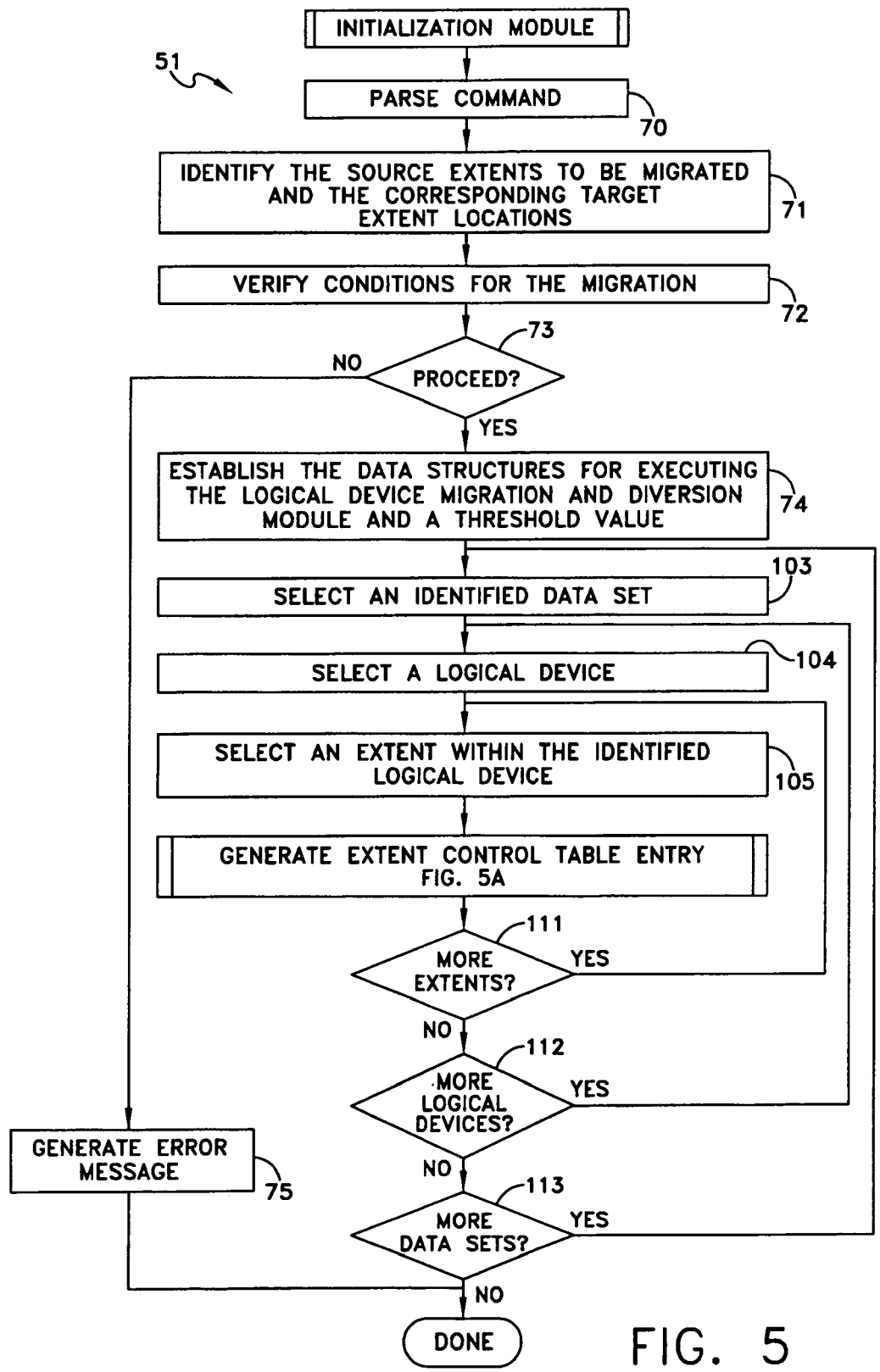
FIG. 5 is a flow diagram of the operation of an initialization module shown in FIG. 3.

More specifically, upon receipt of a command with the initialization argument set, step 57 in FIG. 4 transfers control to step 70 in FIG. 5 that parses the LDM command in step 71. Parsing provides information from the LDM command that identifies the need for consistent data migration and the threshold value. Parsing the LDM command also provides information from which the source extent and the corresponding target extent locations can be determined.

Step 72 verifies the conditions for the migration are satisfied. For example, verification could include determining whether the source and target logical device are compatible. When the conditions are verified, step 73 transfers control to step 74 to continue the initialization module. Otherwise step 73 transfers control to step 75 to generate an error message and terminate any further response to the command, effectively aborting the logical data migration.

Figure 6:
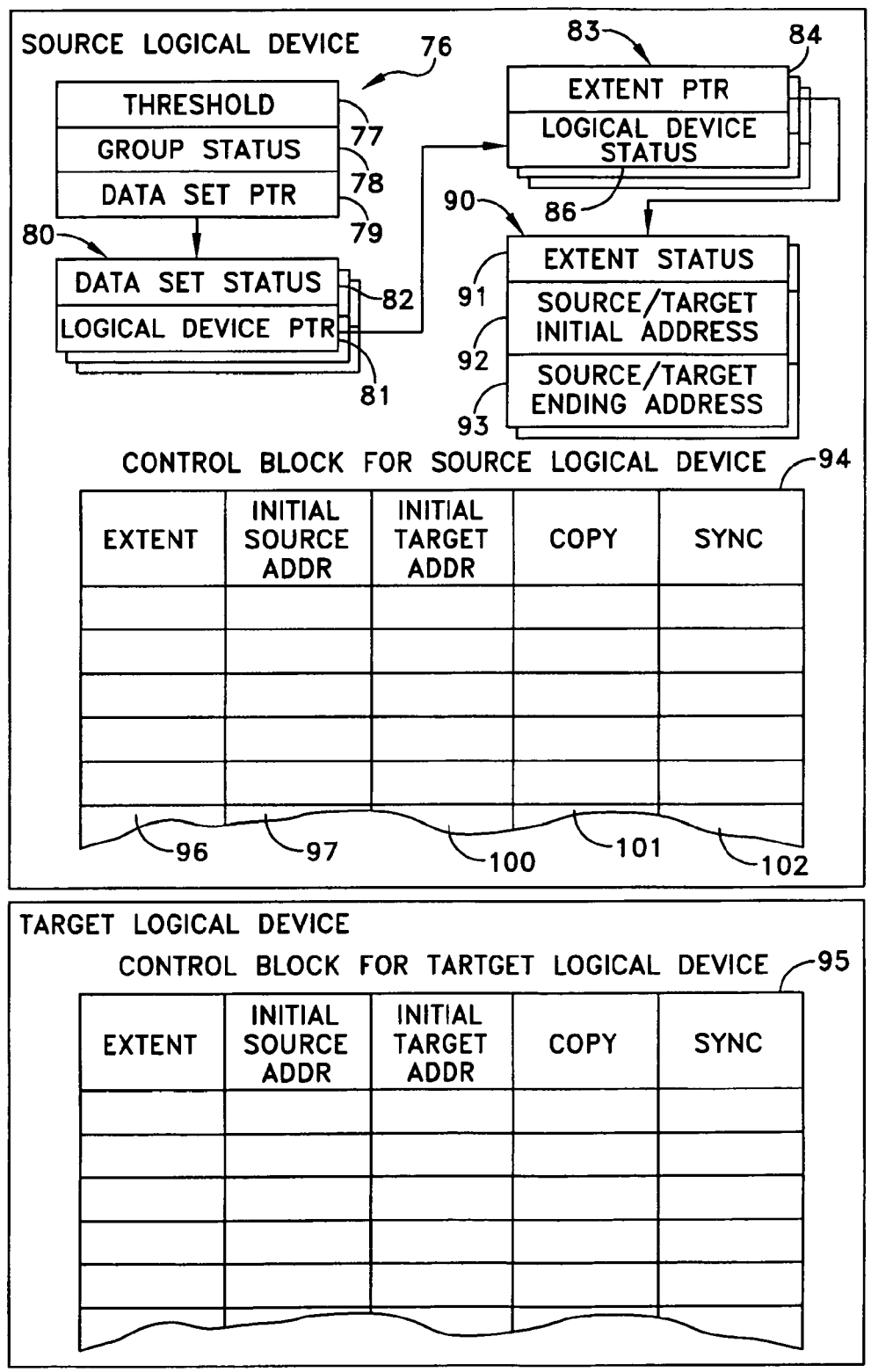
FIG. 6 is a block diagram depicting one example of a data structure generated by the initialization module shown in FIG. 5.

Step 74 establishes data structures corresponding to those shown in FIG. 6 for use during the execution the logical device migration and diversion module 52. It also loads the threshold value upon the corresponding argument or the LDM command. Specifically, FIG. 6 depicts data structures with a group block 76 that receives in different locations a threshold value entry 77, a group status entry 78 and a data set pointer 79. The data set pointer 79 identifies a location for a first data set block 80. Each data set block, such as data set block 82, has locations for a logical device pointer 81 and a data set status entry 82. Each data set block will also include any of various known means to link the individual data set blocks for all the data sets in the group.

The logical device pointer 81 points to a first logical device block 83 that includes locations for an extent pointer 84 and a logical device status entry 85. The extent pointer 84 typically identifies the location of a first extent block, like the extent block 90, for the selected logical device. Links to all other logical devices associated with the data set will also exist.

An extent block 90 includes specific information about a specific extent. One location contains an extent status entry 91. Other locations store representations of addresses, such as initial source and target addresses 92 and ending addresses 93. Each of the addresses 92 and 93 can be constituted by an absolute address or a base addresses or offsets or by some address convention. In the same manner as previously described, links are provided for all the extent blocks associated with a single logical device.

Still referring to FIG. 6, the data structures include track-cylinder control blocks, hereinafter "control blocks", 94 and 95. Control block 94 and blocks 76, 80, 83 and 90 are stored in association with the source logical device. In FIG. 1, the information would be stored in the data storage facility 22. These data structures may be stored in cache memory, a physical disk or both, depending upon the configuration of the data storage facilities. Typically, however, the source logical device control blocks and data pointers will also be stored in the main memory 24 of FIG. 1. Control block 95 typically will be stored on the target logical device.

In an embodiment where control is desired on a track-by-track basis, each entry in the control blocks 94 and 95 includes an extent status entry 96, a single source track address in column 97 and a corresponding target track address in column 100. If an extent occupies one or more complete cylinders, the source and target address entries in columns 97 and 100 can define the address only to the cylinder level. In that event each row in the control blocks 94 and 95 will identify an initial cylinder address. If the extent does not begin and end at a cylinder boundary, the entries will be to a cylinder and head address to provide individual track addressing.

A COPY column 101 records, for each track, whether the track still requires copying. In some situations the copy column 101 may be constituted by a track table associated with the source logical device. In such a case, the control blocks 94 and 95 may also include a SYNC column 102 to reflect the tracks that need to be copied.

Referring to FIGS. 5 and 6 together, after step 74 establishes the data structures in FIG. 6, the remaining steps of FIG. 5 populate the various data structures. As part of this process, step 103 selects one of the identified data sets, such as the data set identified by the data set pointer 79. Steps 104 and 105 use information from the ICF to identify the location of each logical device that stores extents for that data set and one of the extents. In response, a process shown in FIG. 5A generates the extent block control table entries, with step 106 generating the starting and ending addresses for the extent in the source logical device. Step 107 provides the starting address for the extent in the target logical device. When this information has been loaded into blocks 92 and 93 in FIG. 6, respectively, step 108 sets a corresponding extent status entry, like the extent status entry 91, to an initial COPY value to indicate a COPY state.

Step 110 then populates each of the track cylinder control blocks 94 and 95 with data. That is, for each track or cylinder within the identified extent, step 110 makes an entry in a given row. Consequently a given extent may have a number of different entries in the track cylinder control blocks 94 and 95. In addition, step 110 will establish initial values for all the COPY bits in column 101 and all the SYNC bits in column 102 to indicate that each corresponding track must be copied. Step 110 also will set initial status values for each in corresponding status entry.

Figure 5A:
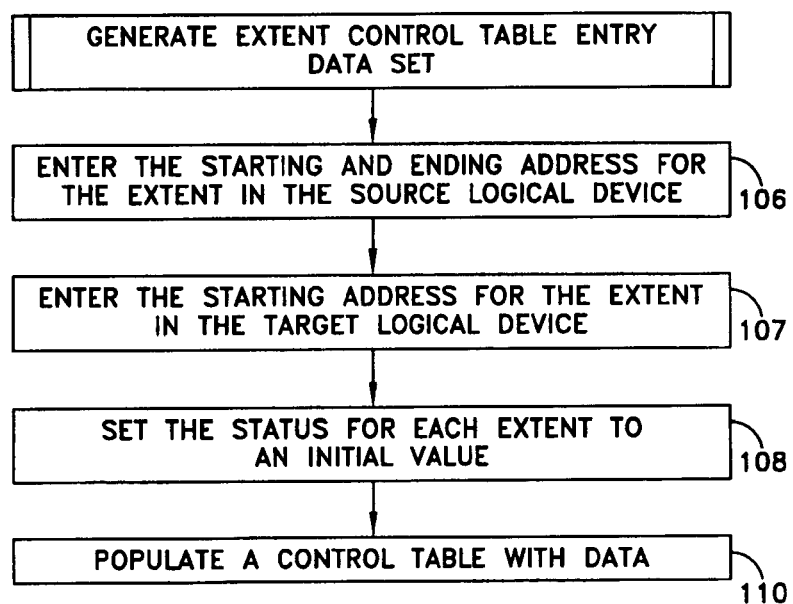
FIG. 5A is a more detailed flow diagram of an operation shown in FIG. 5.

Referring back to FIG. 5, the module uses step 111 as a loop control to assure that the procedure of FIG. 5A populates extent blocks 90 and track cylinder control blocks 94 and 95 for each track in the identified extent. If an additional extent must be processed within the data set, control passes from step 111 back to step 105.

When all the control data for the extents of a data set in the selected logical device have populated the control data structures, step 111 transfers control to step 112 that assures all the logical devices in the data set are processed. If they are not, control passes back to step 104 to select another logical device containing extents for the data set selected in step 103. When all the extents in all the logical devices for a data set have been processed, step 112 transfers control to step 113. Step 113 is a loop control to assure that all the data sets identified in the LDM command have been processed. If additional data sets exist, control passes from step 113 back to step 103. When all the data sets have been processed, operations of the initialization module 51 cease and the data structure in FIG. 6 is fully populated.

Thus, when the initialization module 51 completes its operation, an environment exists for controlling the data migration. The monitor function is active and the data structures are active. Now, by virtue of an LDM command sent with both valid initialization and migration-ad-diversion arguments or a subsequent LDM command with a valid migration-and-diversion argument, the migration and diversion begins.

Logical Data Migration

Migration and Diversion Phase

Figure 7:
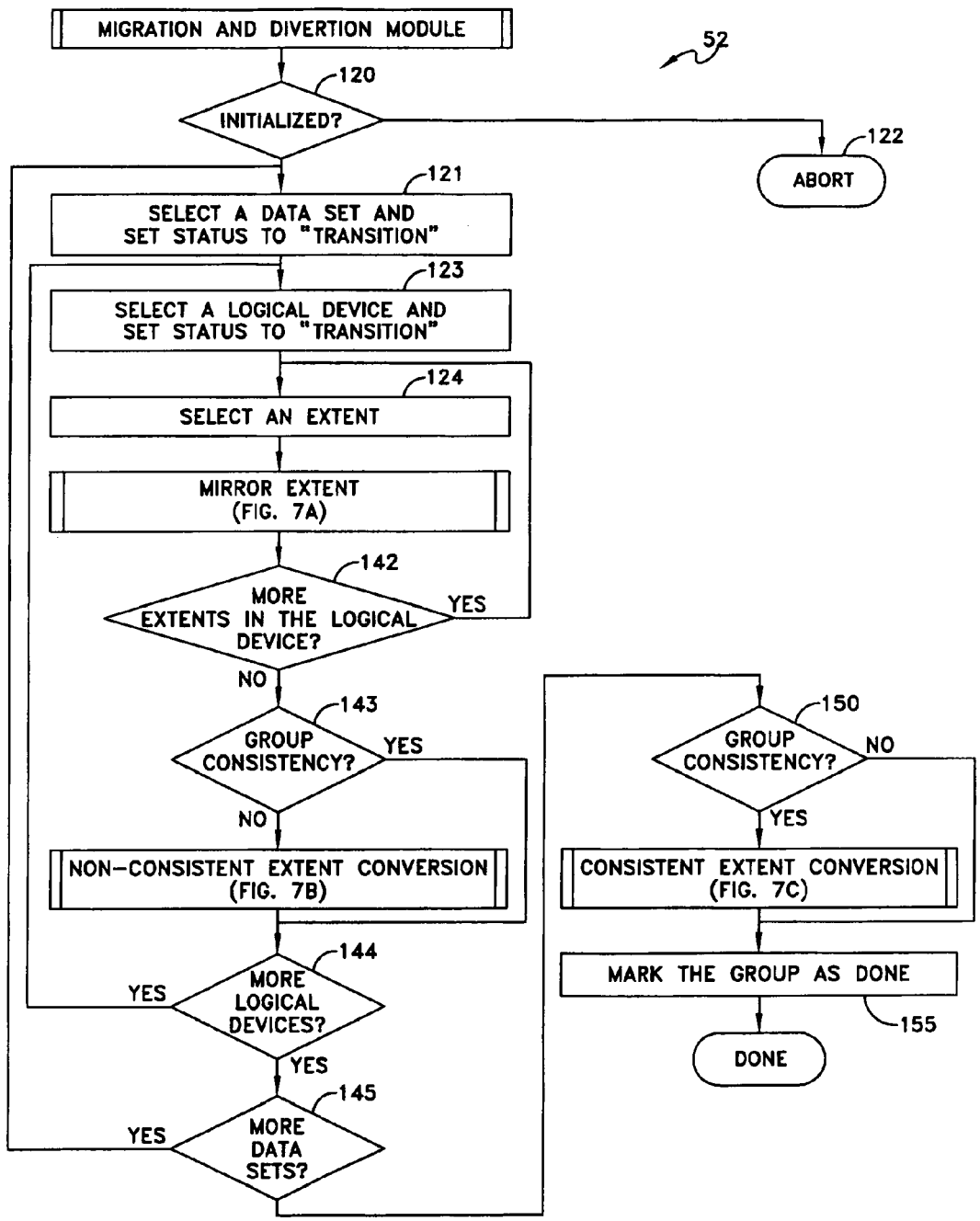
FIG. 7 constitutes a flow diagram of the operation of a migration and diversion module shown in FIG. 3.

FIG. 7 generally depicts the operation of the migration and diversion module 52 by which the migration of data occurs on an extent-by-extent and logical device-by-logical device basis for each data set involved in a data migration. The process begins at step 120 to verify the initialization module 51 has completed the initialization phase. If the initialization phase has been completed, step 120 transfers to step 121 to initiate the remaining steps of the migration and diversion module. Otherwise step 120 transfers control to step 122 that generates an abort message and the migration and diversion phase ends.

Step 121 selects a data set and changes the data set status entry, such as the entry 82 of FIG. 6, to a TRANSITION value. Step 123 performs a similar operation by selecting a logical device in the data set and setting its logical device status entry to a TRANSITION value. The TRANSITION value denotes that the logical device is undergoing a transition to a MIGRATED state.

Figure 7A:
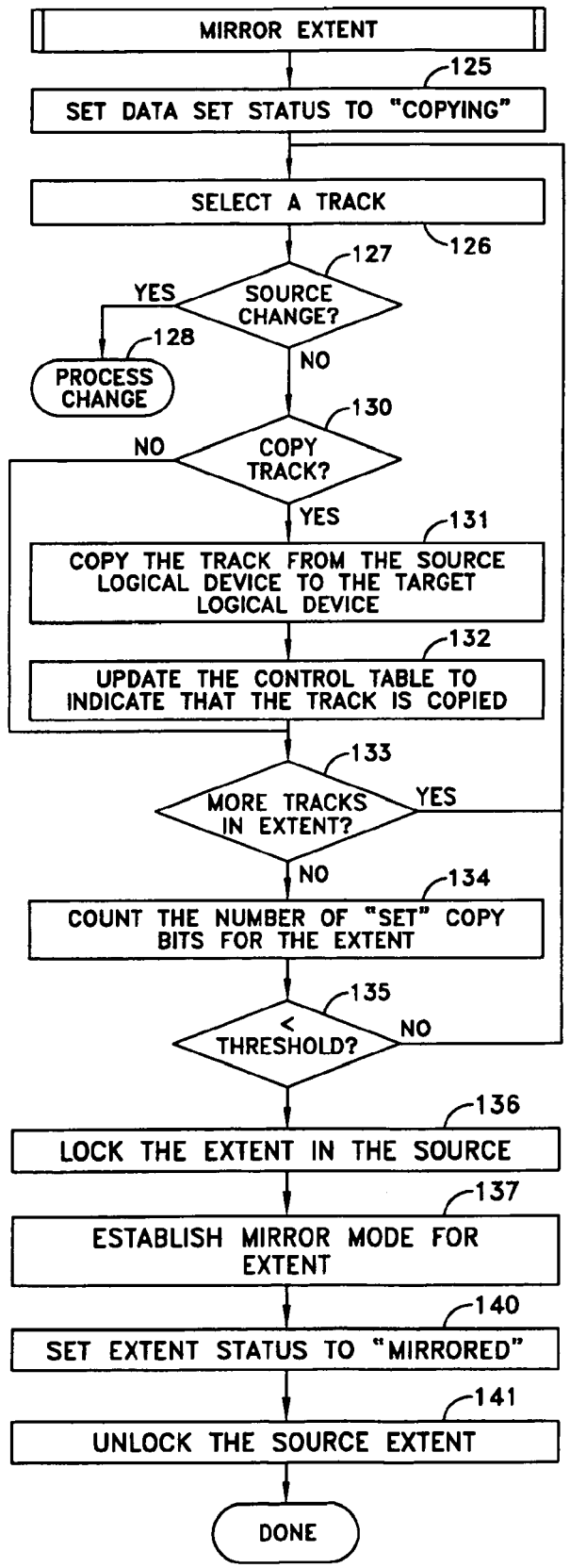
FIGS. 7A, 7B and 7C are more detailed flow diagrams of operations shown in FIG. 7.

Next step 124 selects an extent, such as the extent represented by block 90, to be mirrored. As shown in FIG. 7A, step 125 is a first step in a "mirror extent" processes. Step 125 sets the extent status entry, such as entry 91, to a COPYING value to indicate that the extent is being copied to the target logical device. If an extent is not defined by one or more complete cylinders, step 126 selects a track in the extent. Step 127 determines whether any external operations have changed the source extents based upon information acquired by the monitor module 54 in FIG. 3 or other resources. If a change has occurred, the migration and diversion phase ends through a procedure 128 that processes the change. Otherwise control transfers to step 130.

Step 130 looks to the source control block 94 to identify the specific source track for the identified track in a track row. If the corresponding COPY bit in column 101 is set, step 130 transfers to step 131 to copy the data in the source logical device track to a corresponding track in the target logical device as defined by the track address in the control block 94. Step 132 alters the state of COPY bit and or SYNC bit, depending upon the specific implementation, in the track cylinder control blocks 94 and 95 to indicate that the track has been copied. After step 132 performs its function or if step 130 determines a selected track has already been copied, control transfers to step 123. If more tracks exist in the extent, step 133 returns control to step 126 to select a next track. Alternatively, if the selected extent in the data set is defined at the cylinder level, steps 130 through 132 can be modified to establish the various operations at a complete cylinder level rather than at a track level.

When an extent has been processed in this loop, step 133 transfers control to step 134 that counts the number of set COPY bits, or SYNC bits, for the extent existing in the source logical device control block 94. As will be described later, a user application can alter data in the extents during the COPYING state. Consequently, at the end of a pass through the loop, it is possible that copied tracks have been changed. So the data in the changed tracks must be copied again. Step 134 determines how many tracks need to be recopied. If the number of tracks is at or above a particular threshold as established in the threshold block 77 of FIG. 6, step 135 returns control to step 126 to process the extent again by selecting a track.

This loop comprising steps 126 through 135 continues until a predetermined condition has been reached; in this specific embodiment, the predetermined condition is reached when the number of tracks requiring copying reduces to a value that is below the threshold. Then step 135 transfers control to step 136 in FIG. 7A that is a first step in a process for synchronizing the data in the target logical device extent to the data in the source logical device extent.

This is a serialized process, so step 136 locks the extent in the source logical device to prevent any interaction between applications and the source logical device extent. Step 137 then completes the mirroring operation by transferring the data from any remaining changed tracks to the target logical device. As will be obvious, no interaction with any host application can occur during this interval. When this step has completed, data in the extent of the target logical device mirrors the data in the corresponding extent of the source logical device. Step 140 updates the extent status in a corresponding extent status entry, like the entry 91, to a MIRRORED value indicating that synchronism has been achieved for that extent. Step 141 then unlocks the source extent to re-enable communications between the host and the extent.

After step 141 unlocks the extent, it is again available to user applications. Then control returns to FIG. 7, particularly step 142. If there are more extents in the logical devices, step 142 transfers control to step 124 to repeat the process for mirroring the next extent.

When all the extents in a data set have been transferred, step 142 in FIG. 7 transfers control to step 143 that determines whether the migration is being performed in a consistent fashion. Specifically, step 143 tests the consistency argument in the LDM command. If the argument is valid, the diversion to data migrated to the target logical device or devices is to occur at the same time. In that case, step 143 transfers to step 144 to determine if additional data set extents in other logical devices need to be processed. If extents in additional logical devices for a data set need to be processed, step 144 transfers control back to step 123 to select another logical device containing extents for the selected data set. If all the logical devices have been processed, step 144 transfers control to step 145 to see if extents in additional data sets need to be processed.

Figure 7B:
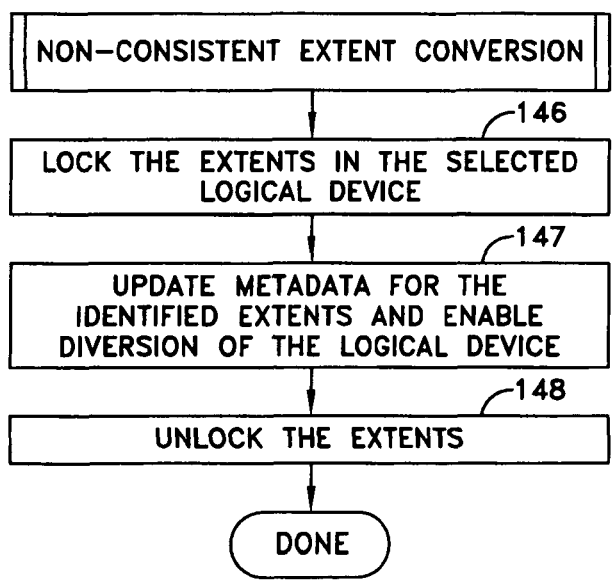

If group consistency is not required, step 143 transfers control to initiate a serialized "non-consistent conversion" process as shown in FIG. 7B where step 146 locks the extents in the selected logical device. Step 147 then updates the metadata for the identified data set extents in the logical device. Step 147 also sets status for the data set to indicate a DIVERTED state by updating a logical device status entry, like the status entry 86 in FIG. 6, and all the corresponding extent status entries, like the entry 91. Step 148 then unlocks the source data set extents and control transfers to step 144 in FIG. 7.

When steps 144 and 145 determine that all the data sets have been completed, step 145 transfers control to step 150. Assuming the group consistency argument was not set in the LDM command, no further action is taken.

When group consistency is required, a "consistent extent conversion" process beings. As will be apparent, the none-consistent extent conversion and consistent extent conversion are mutually exclusive. Like the former, the consistent conversion is a serialized process. This process begins when step 150 transfers control to step 151 in FIG. 7C that locks all the source extents for all the data sets in the group concurrently. Step 152 then updates the metadata for all the source data sets and their extents in the designated group. Next step 153 shifts that status for all the data sets, logical devices and extents in the group to DIVERTED values by updating the extent and data set status entries, such as the entries 78, 82, 86 and 91. When this is complete, step 154 unlocks all the source extents in the group. Control then returns to step 155 in FIG. 7 to mark the identified group as DONE by updating the group status entry 78.

Figure 7C:
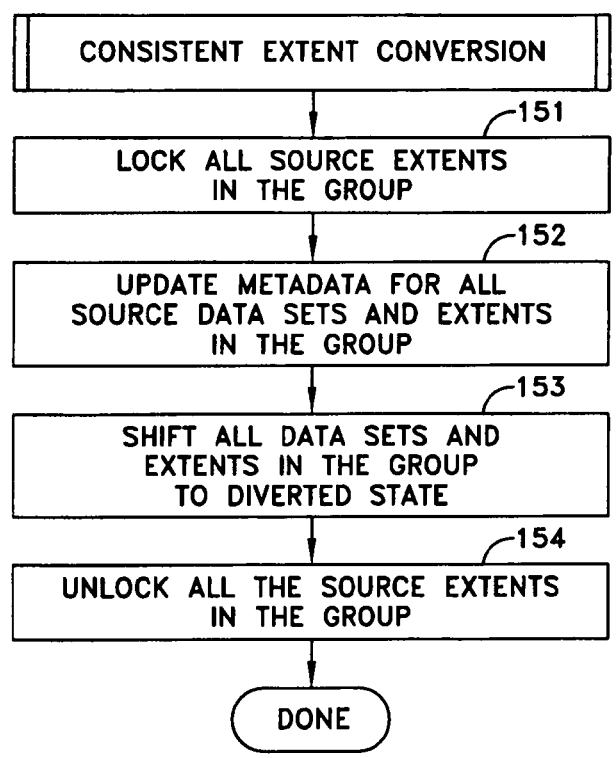

Thus when the migration and diversion module of FIG. 7, including the procedures of FIGS. 7A, 7B and 7C, completes its operation, all I/O requests are diverted to the target logical devices. Eventually the diversion process can also be terminated so the storage areas associated with the migrated data sets can be used for other purposes.

Logical Data Migration

I/O Requests

Figure 8:
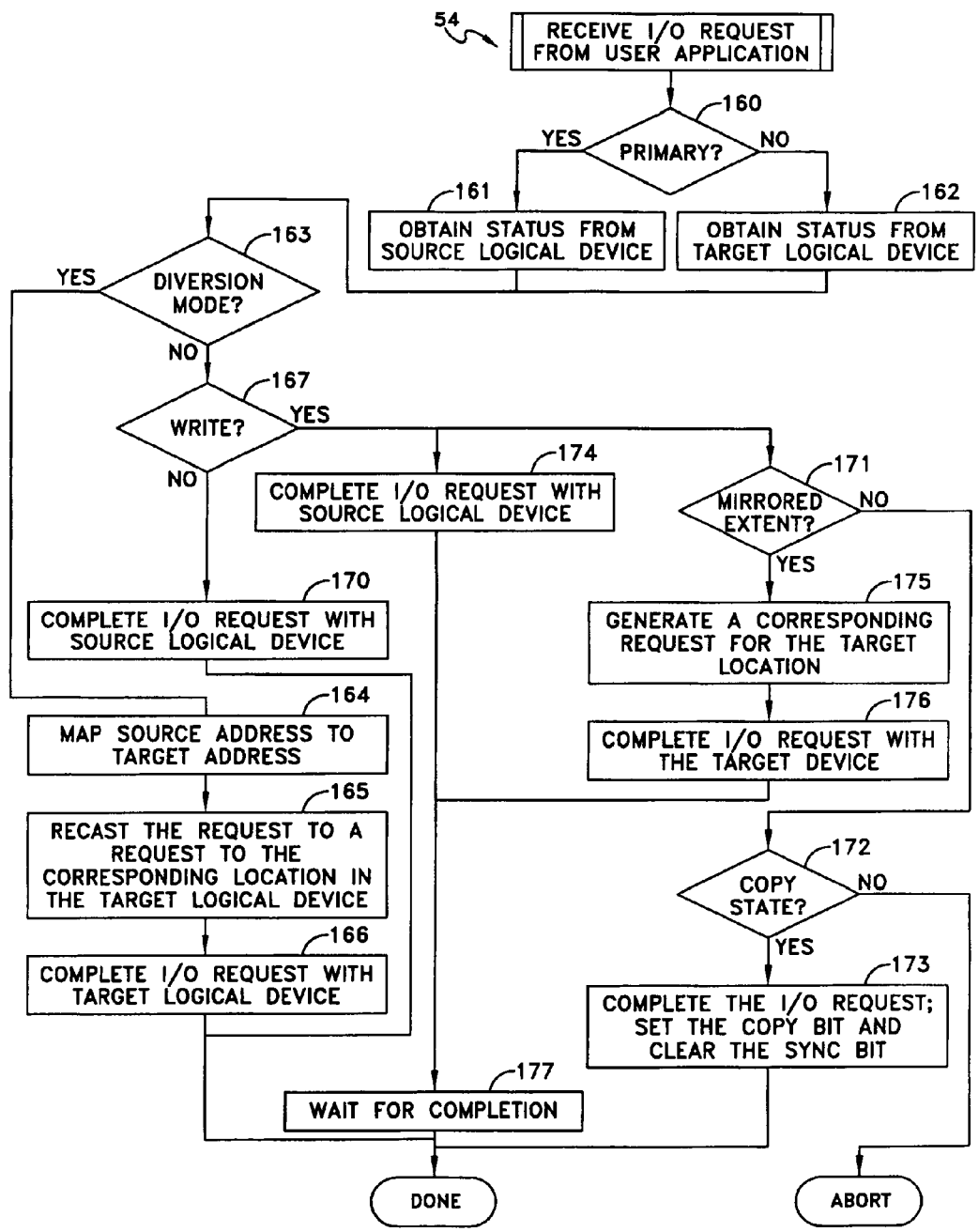
FIG. 8 is a flow diagram of the operation of a monitor module shown in FIG. 3.

To minimize the impact of making a logical data migration concurrently with the normal handling of input-output requests from host applications, it is necessary to continue to respond to I/O requests from such host applications for data even as the extents are being migrated. The monitor module 54 performs this necessary function. Such modules can operate by intercepting I/O requests for special processing by the monitor module 54 as known in the art, one example being disclosed in U.S. patent Ser. No. 10/283,976, which is incorporated by reference herein. FIG. 8 depicts the actions of the monitor module 54 in response to I/O requests from user applications, such as the USR1 application 33 or USR2 application 34 in FIG. 1.

This embodiment of the monitor module 54 also is adapted for use in systems that have multiple hosts. In a multi-host system, one host, like the host 21, is designated a "primary host" or "owner" host. An "owner" is established at group activation time as being the best host to manage the process for a particular data set group. In particular, most if not all of the actual data migration is likely to be done by the Owner. Certain command functions may only be satisfied by the owner although this may be made transparent to the user. Other hosts, such as the host 21A in FIG. 1, are "secondary" or "non-owner" hosts. The non-owner hosts must at the very least monitor I/O requests to the effected data sets and actively participate in the mirror and diversion phases. Each primary and secondary host uses an instance of monitor module 54 to intercept I/O requests while the data migration process is underway with some minor modifications. Thus, it is possible to migrate data from an extent that is accessible to applications in multiple hosts.

Assuming that the requests for a data transfer in a data set being migrated originates with the same host 21 as is processing the migration and diversion module 52 associated with the LDM application 50, step 160 transfers control to step 161 to obtain status, address and other information from the source logical device data structures. Step 160 is representative of the process that monitors operations including the monitoring of changes that is useful in step 127 of FIG. 7A. If the monitor module is operating as a secondary host, step 160 transfers control to step 162 thereby to obtain status and other information from the control block 95 in the target logical device. Step 162 is analogous to step 161. Once this information has been obtained, control transfers to step 163.

Step 163 determines whether the I/O request is directed to a track in a diverted extent as indicated by a corresponding extent status entry, such as in the extent status entry 90 in FIG. 6. If it is, step 163 in FIG. 8 transfers to step 164 that utilizes the status and other information in FIG. 6 to convert the source track address to a target track address. Step 165 recasts the received I/O request to a request to the corresponding location in the target logical device. Step 166 completes this I/O request with the target logical device. No transfer occurs with the track in the source logical device.

During the transition to the DIVERTED state, individual extents exist in either the COPY or MIRRORED states. In that event step 163 transfers to step 167 to determine whether an I/O request includes any write commands. If the I/O request contains only read commands, control transfers to step 170 to retrieve the requested data from the source logical device. There is no need for a read command to interact with an extent in the target logical device prior to the shift to a DIVERTED state. Then the response to the read-only I/O request is complete.

If a write command to an extent is included in an I/O request prior to the shift of the extent to the DIVERTED state, each write command must be handled in a way that assures each identified track in the target logical device remains synchronized to the source logical device track. If the extent is in a COPY state, steps 171 and 172 transfer control to step 173. In this step, the monitor module 54 uses step 174 to complete each write command by updating only the identified tracks with the source logical device. However, step 173 updates the COPY bit and SYNC bit to states indicating that the track needs to be copied again. As a result, the changed data will be transferred to the target logical device thereafter. This completes the response to a write operation involving an extent in the COPY state.

If the extent being written is in the MIRRORED state, step 174 again completes the request for the source logical device. In parallel, step 171 transfers control to step 175 to generate a request to the target logical device using the available mapping data. Step 176 completes the request to the target logical device by writing the data to the corresponding track in the target logical device. Consequently if data is written to a MIRRORED extent the operation of FIG. 8 assures that the changed data sent to the two effected tracks remain identical. For either write operation, step 177 represents an action of waiting for the completion of both parallel processes before indicating that the write operation has been completed.

When the metadata for a data set, or in the case of a consistent group all the data sets being migrated, is updated, all the information necessary to identify the configuration and addresses of the data sets is altered to point to the new locations in the target devices at one time. While any application is open, however, the diversion operation of FIG. 8 continues. However, when an application is stopped and then started, i.e., is recycled, after the data set extents in a logical device are in a DIVERTED state, the application opens the data set with the new or updated metadata based on the various information available concerning storage locations, such as catalog, VTOC and other tables. Thereafter read/write requests from that application directly interact with the target device. There is no further requirement for interaction with the source logical device or for the operation of the monitor module functions shown in FIG. 8.

Logical Device Migration

Termination Phase

Figure 9:
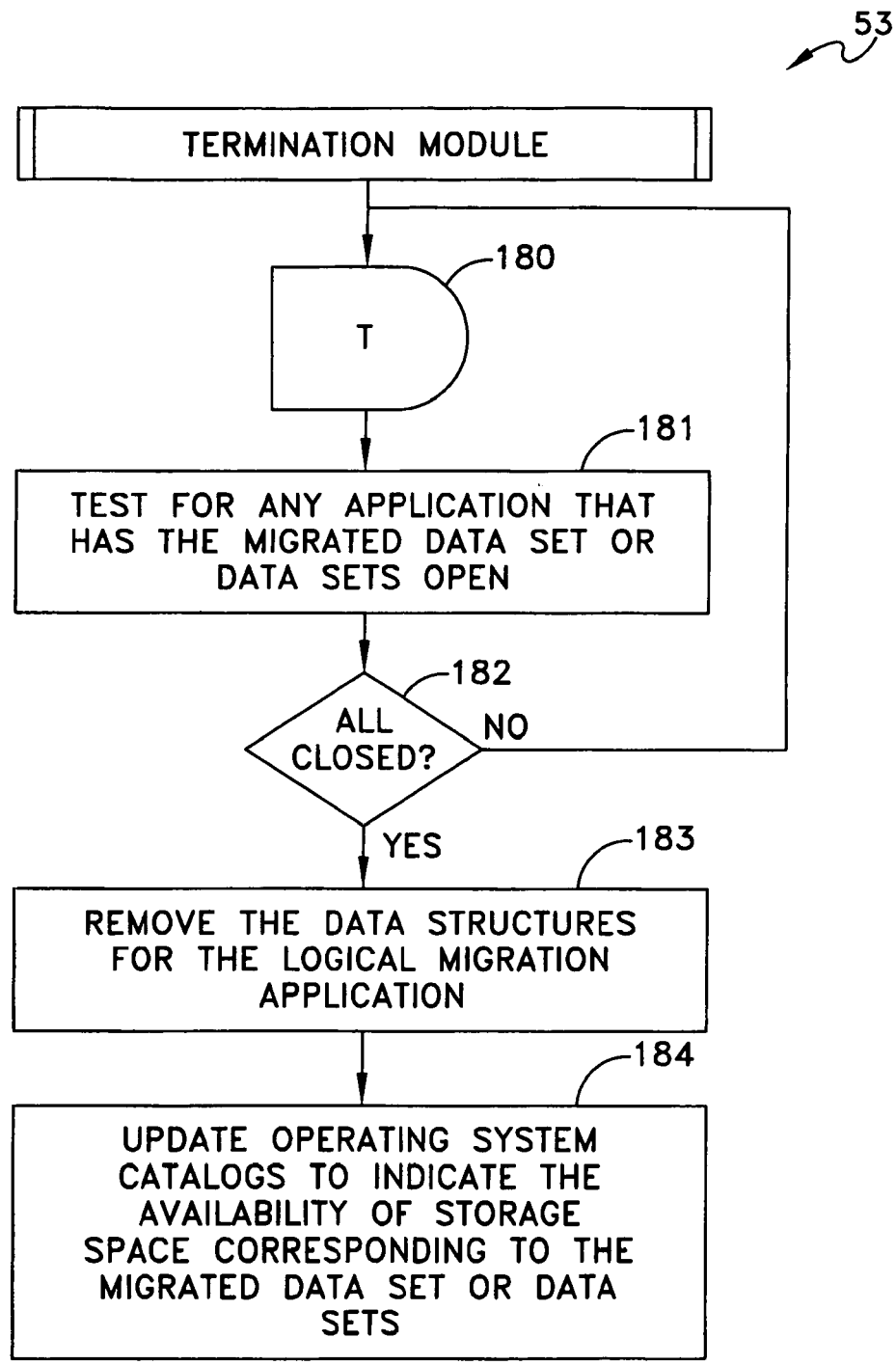
FIG. 9 is a flow diagram of the operation of a termination module shown in FIG. 3.

When all applications that were running at the time of the data migration have terminated once after a migration, there is no requirement to retain the source data sets. When this condition exists, the system can enter the termination phase. As shown in FIG. 9, the termination module 53 includes a delay 180 that might be used during the process. Step 181 tests to determine whether any application started before the data migration continues to run. If not all the applications have recycled, step 182 transfers control back to step 180 to wait for some arbitrary time before trying this test again. In some situations it may become necessary to terminate and immediately restrict any application that had been initiated prior to the logical data migration in order to complete the termination process.

In either event, when all applications that were interacting with data during the logical data migration have been closed once since the migration has been completed, step 183 can remove the data structures for the logical migration application, such as the data structure shown in FIG. 6, from all related areas of the data processing system. Step 184 then can update the VTOC or any equivalent data structure to make the locations for the migrated source extents available for other purposes.

The foregoing description relates to a specific embodiment of a method and apparatus for migrating one or more data sets from one or more source logical devices to one or more target logical devices. The data migration may involve a single data set of a single extent or multiple extents. Further, the data migration may involve groups of data sets with the option of performing the transfer of all the data sets in a group in a consistent manner. In whatever form, the migration is transparent to other applications that may be using the data concurrently. The process involves only minimal interruption in data processing by such user applications.

The various objectives of the system described herein are realized by means of the utilization of a logical data migration application that responds to a command. The command identifies all the extents to be migrated in a source logical device and locations in the target logical device to receive those extents. As there is a corresponding address in the target logical device for each extent in the source device, it is possible for diverse extents and data sets to be transferred to a single logical device, unlike prior art data migration systems. At initialization the process generates and populates various control data structures. During migration and diversion, the application copies extents on a track-by-track or cylinder-by-cylinder basis for one or more source logical devices to one or more target logical devices based upon address information in the control data structures. During these operations, a monitor module responds to I/O requests from other applications to the extent in this phase by processing the request and, in the case of write operations, updating the information in the control data structures.

During migration and diversion each extent in the target logical device is mirrored from the corresponding extent in the source logical device in a serialized process. During this process a lock is placed on the extent being mirrored for the duration of time to copy any as yet un-copied tracks to the target device without interruption by a user application. As the serialize process acts on extents, the likelihood that the interruption will effect an application is minimized. After an extent is mirrored, the monitor function responds to write requests by updating both the source and target logical devices.

After the data set extents in a logical device or a group of data set extents in multiple data sets have been mirrored, the migration and diversion module shifts each extent to a DIVERTED state, the timing of which is dependent upon the requirement for group consistency. After the data set extents in a logical device are diverted, the monitoring function intercepts all I/O requests and recasts them to a target address and reissues the request.

This diversion operation continues to handle all I/O requests from any application until such time that application closes a data set. When the application opens that data set again, I/O requests will be directed to the target logical device because at the time of the diversion all the metadata related to the diverted data sets is updated.

The system described herein has been disclosed in terms of certain embodiments. It will be apparent that many modifications can be made to the disclosed apparatus without departing from the system described herein. For example, the system described herein has been described with respect to a specific implementation in a Symmetrix data storage facility available from the assignee of this application. However, the basic functions that implement the logical data migration of the system described herein are readily adapted for other types of data storage facilities. The disclosure additionally includes specific references to organizations of the logical data migration modules such as shown in FIG. 3 and specific sequences of operations as shown in FIGS. 4, 5, 5A, 7, 7A, 7B, 7C, 8 and 9. Variations in these sequences and the specific functions of each particular step may be altered to implement the system described herein with another type of data storage facility or for the purpose of integrating the logical data migration system with other applications or for utilizing existing utilities such as available in commercially available operating systems. Further, the system described herein has been described in terms of a specific transfer between two logical devices and a source data storage facility and a single logical device in a target data storage facility. The system described herein is equally applicable to performing migrations within a single data storage facility.

It will be apparent that FIG. 6 depicts a specific data structure and organization. Persons of ordinary skill in the art will have the knowledge to implement this specific structure and organization or to adopt other structures and organizations for implements the specifically disclosed structures and organization.

It is useful to have metrics to determine when to dynamically reconfigure a system to migrate data from one or more logical devices to a different one or more logical devices as described above. Although in some cases the decision to migrate data may be made in accordance with phasing out old hardware, in other instances it may be useful to migrate data when the performance of the device(s) on which the data is stored is not meeting expectations.

The IBM Corporation provides DFSMS, which allows allocation of data sets based on criteria that is input when the data set is created. For example, if a user is interested in having a particular performance for a data set (e.g., a particular millisecond response time), then a user would input the desired performance characteristic to DFSMS and would automatically be allocated an appropriate storage device that is supposed to meet or exceed the desired performance characteristics. However, there are limitations to this system. In the first place, if after the initial allocation the storage device does not meet the performance requirements, there is no mechanism readily available in DFSMS to reallocate an already allocated data set while the data set is also being accessed by another application. In such a case, a user would notice a performance shortfall, manually allocate a new data set space on a different device, terminate all applications accessing the data set, and move the data from the old data set space on the old device to the new data set space on the new device. In addition, sometimes the desired performance of a data set changes. For example, a user may initially allocate a data set with a four millisecond response time. Later, the user may decide that a three millisecond response time is more appropriate, either because of changing circumstances or because the user underestimated the performance needs. Just as with the previous example, a user would notice a performance shortfall, manually allocate a new data set space on a different device, terminate all applications accessing the data set, and move the data from the old data set space on the old device to the new data set space on the new device.

Accordingly, it is desirable to be able to automatically monitor data set performance and reallocate data sets when performance is not appropriate. It would also be desirable to be able to automatically reallocate data sets based on any other appropriate criteria, such as data management objectives.

Figure 10:
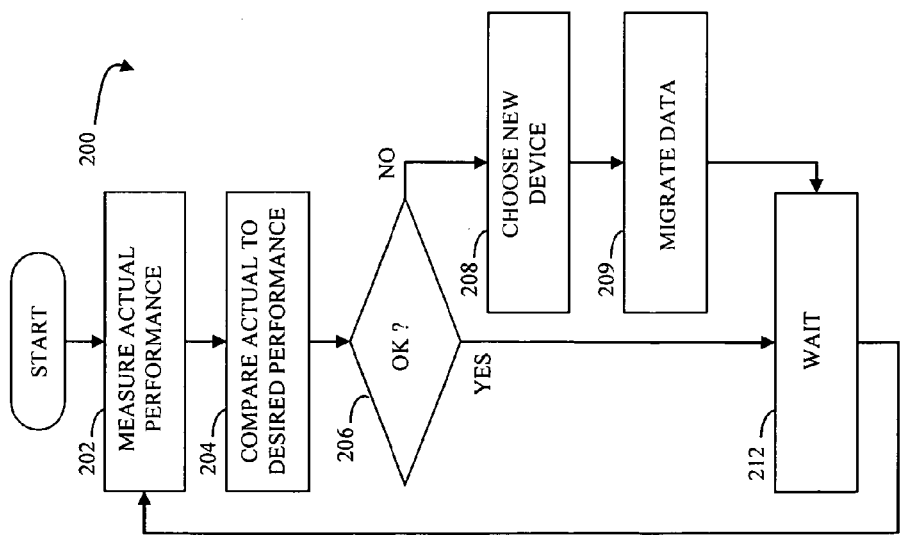
FIG. 10 is a flow diagram illustrating deciding whether to perform dynamic data set migration.

Referring to FIG. 10, a flow diagram 200 illustrates steps performed in connection with the system described herein that automatically monitors data set performance and reallocates (moves) data sets to different devices when appropriate. Note that, in some instances, data sets may be spread across more than one device. Thus, it is possible to move only a portion of a data set (e.g., a portion on a particular device) without moving other portions. Accordingly, for the discussion herein, it is understood that reallocating (moving) a data set also refers to reallocating (moving) only a portion of a data set.

Processing begins at a first step 202 to measure the actual performance of the storage device on which a data set is stored. Measuring storage device performance is fairly straightforward and involves, for example, recording performance characteristics that are either provided directly by the device or ascertaining characteristics based on other values associated with the storage device. Possible performance characteristics that may be used are described elsewhere herein.

Following the step 202 is a step 204 where the actual performance, measured at the step 202, is compared with the desired performance to determine if the actual performance meets or exceeds the desired performance. Note that, as used herein, "performance" may be understood broadly to include data management objectives (e.g., type of remote mirroring used), as described elsewhere herein. Like the step 202, the step 204 is fairly straightforward. As described in more detail elsewhere herein, a set of desired performance characteristics may be associated with each data set and/or a group of data sets. Following the step 204 is a test step 206 which determines if the result of the comparison of the step 204 is okay (i.e., the actual performance meets or exceeds the desired performance). If the result of the comparison is not okay, that is, if the actual performance does not meet or exceed the user's desired performance, then control passes from the test step 206 to a step 208 where a new device for the data set is chosen. Choosing a new device at the step 208 is described in more detail elsewhere herein. Following the step 208 is a step 209 where the data is migrated, as described elsewhere herein.

Following the step 209 or following the step 206 if the actual performance meets or exceeds the desired performance, is a step 212 where the processor waits. The step 212 is optional, but may be used beneficially to control the timing of the loop in the flow diagram 200. Following step 212, control transfers back to the step 202, discussed above.

Referring to FIG. 11, a flow diagram 220 illustrates in more detail the step 208 of the flow diagram 200 FIG. 10 where a new device is chosen. Processing for the flow diagram 220 begins at a first step 222 where a device index, DI, is set to one. The device index, DI, is used to iterate through all of the possible storage devices that may be selected. Following the step 222 is a step 224 where a criteria index, CI, is set to one. The criteria index, CI, may be used to iterate through all the possible criteria to determine which devices do, or do not, meet or exceed the desired criteria.

Following step 224 is a test step 226 which determines if the device index criteria, DI, exceeds some predetermined value (referred to as DIMAX at the step 226) corresponding to the number of possible devices. If so, then control transfers from the step 226 to a step 228 where an error is posted. Note that if the device index, DI, exceeds the number of possible devices, then there is no device that meets the desired criteria.

Thus, an error is posted at the step 228 to alert the calling routine that no device is acceptable. Following step 228, processing is complete.

If it is determined that the test step 226 that DI is not greater than the number of devices, then control transfers from the test step 226 to a test step 232 to determines if the criteria index, CI, exceeds a predetermined number (CIMAX) that corresponds to the number of possible criteria. If so, then control transfers from the step 232 to a step 234 where the routine returns the particular device being examined, referred to as DEV[DI]. Note that if the system iterates through all of the criteria and the particular device being examined, DEV[DI], meets or exceeds each of the criteria, then CI will continue to be incremented until CI exceeds the number of possible criteria (CIMAX), in which case the device DEV[DI] has met or exceeded all of the desired criteria. Following the step 234, processing is complete.

If it is determined that the test step 232 that the criteria index, CI, does not exceed the number of possible criteria, then control transfers from the test step 232 to a test step 236 where it is determined if the device being examined DEV[DI] meets or exceeds the particular criteria CRIT[CI]. If so, then control transfers from the test step 236 to a step 238 where the criteria index, CI, is incremented. Following the step 238, control transfers back to the test step 232, discussed above.

If the device DEV[DI] does not meet the particular criteria CRIT[CI] at the step 236; then control transfers from the step 236 to a step 242 where the device index, DI, is incremented. Thus, the step 236 rejects any devices that do not meet all of the desired criteria. Following step 242, control transfers back to the step 224 where the criteria index, CI, is set to one to begin iterating through the criteria for another device. Thus, the steps of the flow chart 220 are executed until either there are no devices that meet all of the desired criteria, as evidenced by the step 228, or there is at least one device that meets all the desired criteria, as evidenced by the step 234. Thus, either the step 228 is reached, indicating that there are no devices that meet the desired criteria, or the step 234 is reached indicating that there is at least one device that meets all of the desired criteria.

In addition to the millisecond response time criteria discussed above in connection with DFSMS, other criteria may be used to select a storage device for a data set or group of data sets. The other criteria include read performance time, write performance time, control performance time, mirror performance time (i.e., the performance of a mirror for a logical device), connectivity type to the storage device (e.g., FICON, ESCON, parallel channels, IP attached storage, etc.), local mirroring type (e.g., RAID 1, RAID 5, RAID 10, etc.) remote mirroring type (e.g., J0/J1 RDF, adaptive copy RDF, SRDF/A, SAR, STAR, PPRC (with variations), etc.), maximum data set size, date dependant performance, back-up frequency, and number of back-ups. Note that, as used herein, "performance" may be understood broadly to include data management objectives (e.g., type of remote mirroring used). Thus, the performance criteria could be broadly understood to include things like mirroring type or maximum data set size. Generally, the performance criteria can be any desired characteristic of the system that may be ascertained and that may differ between storage devices on which the data set may possibly be placed.

Appropriate mechanisms may be used to measure the performance at the step 202 and compare the performance at the step 204. Thus, for example, if the criteria of frequency of back-ups is used, the actual performance measure at the step 202 is the frequency of back-ups for a particular storage device while the value compared at the step 204 with the actual criteria 202 is the desired frequency of back-ups provided by a user for a particular data set or group of data sets. Similarly, if the criteria is connectivity type, then the actual performance measured at the step 202 is the actual connection to a storage device which is compared at the step 204 with the connectivity type desired by the user (e.g., ESCON) for a data set or group of data sets. Measuring these different criteria and comparing these different criteria to the actual criteria is straightforward to one of ordinary skill in the art. Any other appropriate criteria may be used. Note that the desired performance associated with a data set or group of data sets may itself be stored in a data set or otherwise maintained by some other appropriate means. Similarly, the measured actual performance may also be stored in a data set or maintained by some other appropriate means.

The system described herein may be used with DFSMS using a parallel set of classes similar to the set of classes provided by DFSMS. There may be other mechanisms used as hooks to provide the functionality described herein with DFSMS. It is also possible to implement the system described herein without using DFSMS by providing a mechanism where a user may specify performance/management rules that the system uses to determine whether to migrate any data sets.

Figure 12:
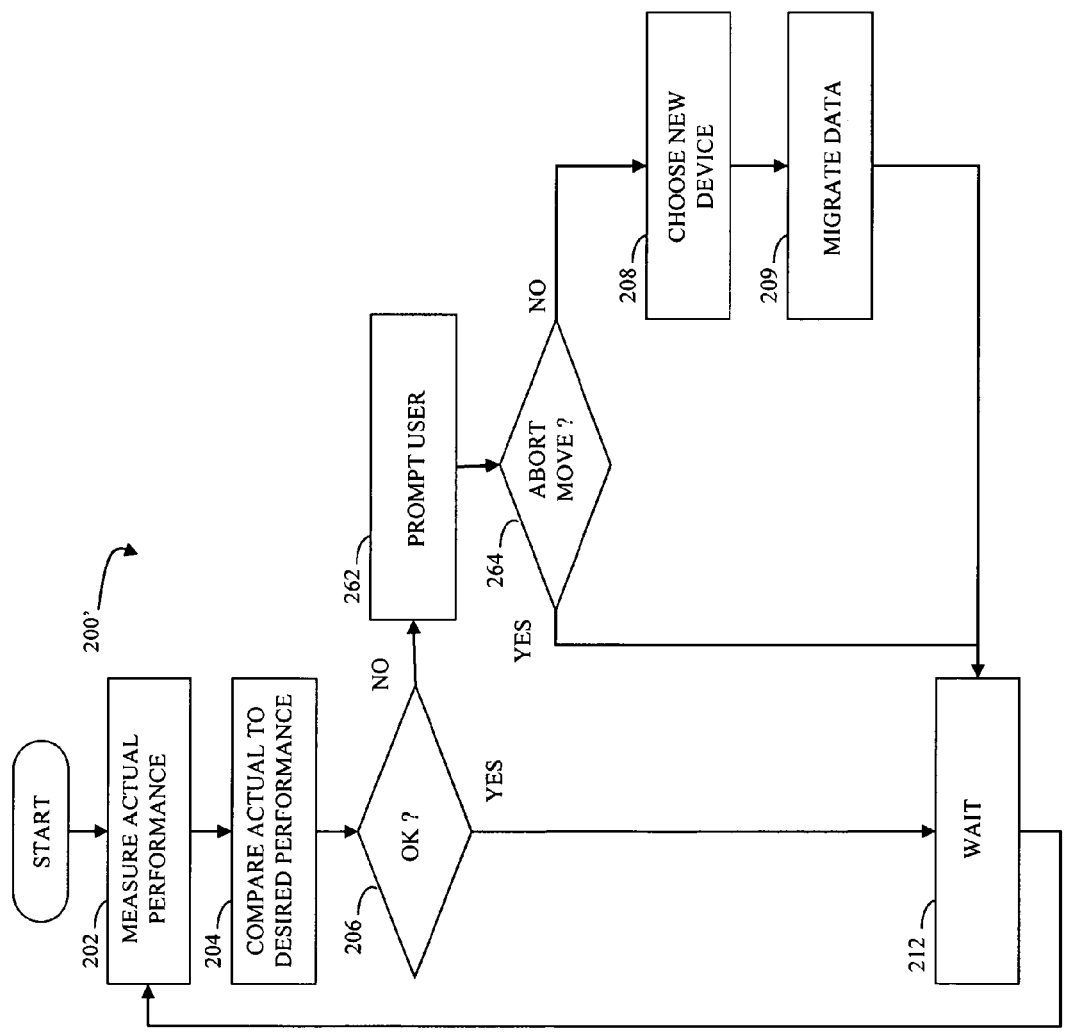
FIG. 12 is a flow diagram illustrating an alternative embodiment for deciding whether to perform dynamic data set migration.

Referring to FIG. 12, a flow chart 200' illustrates an alternative embodiment of the processing illustrated by the flow chart 200 of FIG. 10. In the embodiment illustrated by the flow chart 200' of FIG. 12, the user has the option of aborting the move even though the system has detected that the desired performance (or data management characteristics) has not been met. Elements of the flowchart 200' having the same reference number as elements of the flow chart 200 perform analogous functions and thus are not described below.

If it is determined at the test step 206 (described above) that the result of the comparison of the step 204 is not okay, then control passes from the step 206 to a step 262, where the user is prompted to confirm that the data set should be moved. Following the step 262 is a test step 264 which determines if the user has decided to abort moving the data set. If so, then control passes from the step 264 to the step 212, discussed above. Otherwise, if the user chooses not to abort the move, control passes from the step 264 to the step 208, discussed above. In some instances, it may be desirable to set a flag to prevent the user from being prompted too often (or ever again) after the user has initially indicated that the data set is not to be moved.

Note that it is possible in some embodiments to provide a mechanism that allows a user to request selective monitoring of a subset of devices and/or data sets. Such a mechanism could be provided in any number of ways, including using configuration files that are accessed by the system, prompting a user, etc.

In some cases, there may be a concern that data on a disk or tape or other medium could be compromised, especially in instances where the data includes personal records of thousands of customers. In some situations, it is desirable to provide data encryption without having to modify any applications that use the data. As described in more detail below, it may be possible to use the data migration mechanism discussed herein to provide such application-independent encryption.

Figure 13:
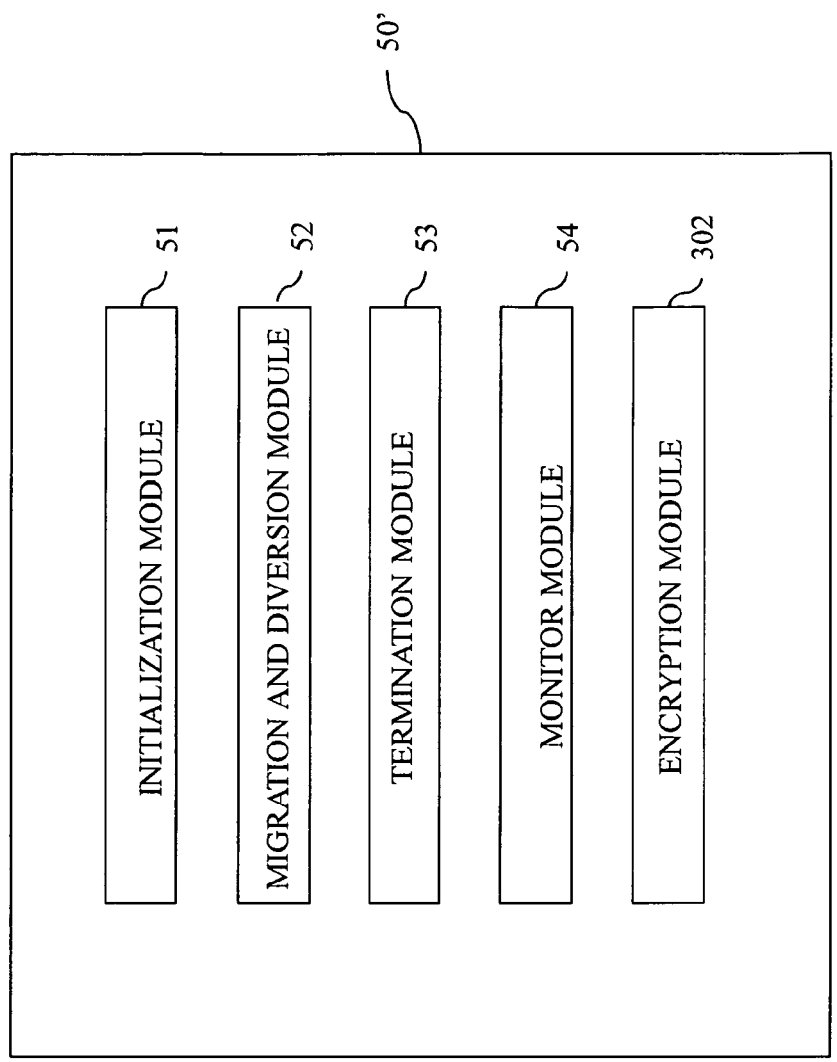
FIG. 13 is a block diagram of the organization of an alternative embodiment of a logical migration application that operates in accordance with the system described herein.

Referring to FIG. 13, a data migration application 50' is like the data migration application 50 of FIG. 3 in that the application 50' contains an initialization module 51, a migration and diversion module 52, a termination module 53, and a monitor module 54. The application 50' may also contain an encryption module 302 that may be used to encrypt data as the data is migrated. However, as discussed elsewhere herein, data may also be encrypted without being migrated to another location. The system described herein may provide encryption/decryption to or from any type of storage medium or device, including disk storage, tapes, DVD's, etc.

In an embodiment herein, the encryption module 302 may use generally known and publicly available encryption/decryption algorithms. For example, the algorithm may be one in which the encryption key is publicly known and available while the decryption key is kept secret by one or more entities that use the decryption key to decrypt data. For such encryption/decryption systems, knowledge of the public encryption key does not provide access or knowledge of the decryption key and/or of the unencrypted text. Examples of such encryption/decryption techniques include the public key encryption provided by RSA Systems of Bedford, Mass.

Other systems may be used for encryption/decryption. For example, the encryption/decryption may be provided by one or more systems that use the IBM Common Cryptographic Architecture (CCA), such as the S/390 system provided by IBM. Other systems may be used that do not rely on any public keys but, instead, use only private keys. For such systems, the measures applied to prevent compromise of the key(s) when decrypting may also be applied to the key(s) when encrypting.

Referring to FIG. 14, the encryption module 302 is shown in more detail as having an input for providing clear (unencrypted) data to the encryption module 302. The encryption module 302 also receives as input an encryption key. As discussed elsewhere herein, the encryption key may be publicly known and available and thus may not require any special handling or vaulting. FIG. 14 also shows an output of the encryption module 302 being the encrypted data. In operation, unencrypted data is provided as an input to the encryption module 302 along with the encryption key. The encryption module 302 may use any one of a number of the well-known and publicly available public key encryption algorithms to encrypt the data.

Referring to FIG. 15, a flow chart 310 illustrates steps performed in connection with a portion of the data migration when data migration is coupled with encryption as described herein. The steps of the flow chart 310 may be performed in connection with the step 131 of the flow chart of FIG. 7A where tracks are copied from a source logical device to a target logical device. The steps of the flow chart 310 may also be performed in connection with the step 137 of the flow chart of FIG. 7A. At the step 137, remaining data is copied from the source logical device to the target logical device in connection with data migration.

Processing for the flow chart 310 begins at a first step 312 where an encryption key is obtained. As discussed elsewhere herein, it is possible to use public key cryptography where the encryption key is publicly available and well-known and does not need to be vaulted or kept secret. Following the step 312 is a step 314 where the encryption key is applied to the data being copied from the source logical device to the target logical device. Following the step 314 is a step 316 where the encrypted data is provided to the target logical device. Following the step 316, processing is complete.

As discussed elsewhere herein, decrypting the thus-encrypted data may be a little more involved since the decryption key should be kept secret. As discussed elsewhere herein, there are a number of techniques for maintaining the secrecy of the decryption key. For the system described herein, the decryption key is maintained within the storage device that stores the data or is maintained with the data migration application so that if a malicious (unauthorized) user were to copy the encrypted data onto a tape or other medium or to remove one or more drives from the storage device, the encrypted data would be unusable because the decryption key is maintained with the storage device or data migration application and thus may only be used by authorized users. Mechanisms that may be used for implementing this are described elsewhere herein.

Referring to FIG. 16, a flow chart 320 illustrates steps that may be performed in connection with decrypting data. Processing begins at a first step 322 where the data is decrypted using the secret/private key. Decrypting the data at the step 322 is described in more detail elsewhere herein. Following the step 322 is a step 324 where the decrypted data is provided to the authorized user of the storage device. Following the step 324, processing is complete.

Note that the functionality described herein may be implemented in connection with a data migration to another location, an "in-place" data migration (described elsewhere herein), or as part of the storage process for one or more volumes, files, and/or any other type of storage unit. For example, a user may create a particular logical volume for storing sensitive data and may configure the system to always encrypt data stored to that volume. In that case, the system will cause data written to that volume to be encrypted and will cause data to be read from that volume (by an authorized user) to be decrypted. As described elsewhere herein, the encryption/decryption may be performed in a manner that is transparent to an application running on a host. For example, the encryption/decryption functionality may be provided on the storage device. Alternatively, the encryption/decryption functionality may be provided on one or more hosts using process(es) that intercept host reads and writes from and to the storage device in order to perform the encryption and decryption.

Figure 17A:
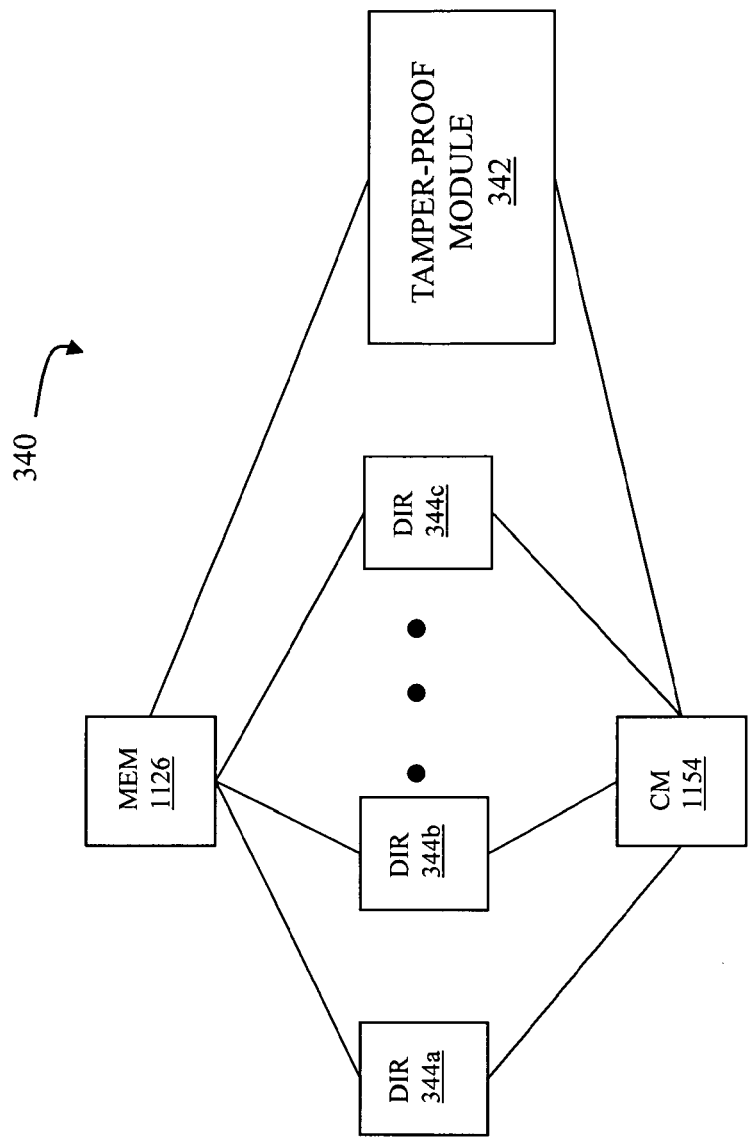
FIG. 17A is a diagram that illustrates an embodiment where a storage device includes a tamper-proof module.

Referring to FIG. 17A, a diagram 340 illustrates an embodiment where a storage device includes a tamper-proof module 342. The diagram 340 also shows a plurality of directors 344a-344c that are coupled to a memory 346 that is internal to the storage device. Each of the directors 344a-344c may represent a host adaptor, a disk adaptor, and/or a remote adaptor. In an embodiment herein, there may be up to sixteen directors coupled to the memory 346. Of course, for other embodiments, there may be a higher or lower maximum number of directors that may be used.

The diagram 340 also shows an optional communication module (CM) 348 that provides an alternative communication path between the directors 344a-344c and/or the tamper-proof module 342. Each of the directors 344a-344c and/or the tamper-proof module 342 may be coupled to the CM 348 so that any one of the directors 344a-344c and/or the tamper-proof module 342 may send a message and/or data to any other one of the directors 344a-344c and/or the tamper-proof module 344 without needing to go through the memory 346. The CM 348 may be implemented using conventional MUX/router technology where a sending one of the directors 344a-344c and/or the tamper-proof module 342 provides an appropriate address to cause a message and/or data to be received by an intended receiving one of the directors 344a-344c and/or the tamper-proof module 342. In addition, a sending one of the directors 344a-344c and/or the tamper-proof module 342 may be able to broadcast a message to all of the other directors 344a-344c and/or the tamper-proof module 342 at the same time.

Figure 17B:
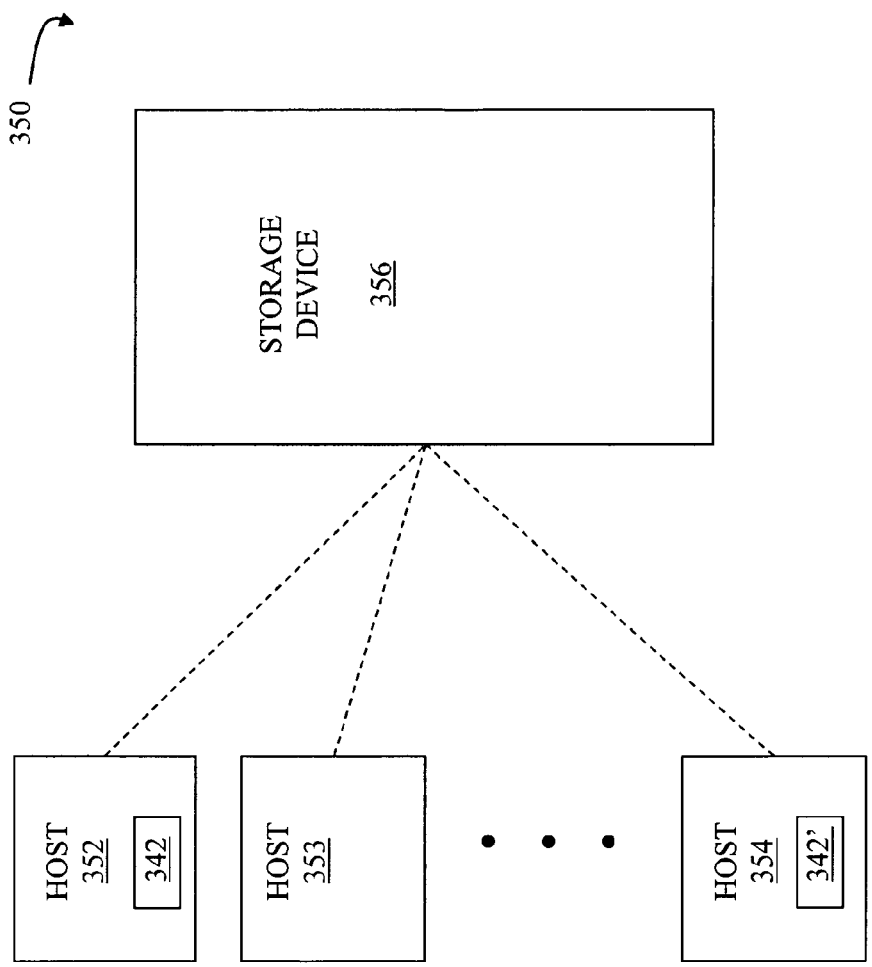
FIG. 17B is a diagram that illustrates an embodiment where a plurality of host devices may each include a tamper-proof module.

Referring to FIG. 17B, a diagram 350 illustrates an embodiment that includes a plurality of hosts 352-354 coupled to a storage device 356. Each of the hosts 352-354 may interact with the storage device 356 independent of each other. Alternatively, some or all of the hosts 352-354 may interact with the storage device 356 in concert. The diagram 350 shows the hosts 352 containing the tamper-proof module 342 while the host 354 contains its own version of a tamper-proof module 342'. In the embodiment illustrated by the diagram 350, the functionality of the tamper-proof modules 342, 342' is moved from the storage device 356 (illustrated by the diagram 340 of FIG. 17A) into each of the hosts 352-354.

Note that it is not necessary for all of the hosts 352-354 to have a tampered-proof module. For example, the diagram 350 shows the hosts of 353 as not including a tamper-proof module. In some embodiments, it is only necessary to provide a tamper-proof module to hosts performing the encryption/decryption function described herein. Note also that it is possible to have encrypting be performed on either the storage device or one of the hosts while decrypting is performed on the other one and that, generally, the functionality described herein may be provided on any appropriate device or combination of devices and may even be moved during operation.

Note that, in instances where data where data is always encrypted for a particular volume, file, or other storage unit (i.e., where data is encrypted at the time of creation and thereafter), it may be advantageous to have the tamper-proof module 342 be in the host(s) to avoid clear-text transmission of data between the host(s) and the storage device. On the other hand, in instances where data is being encrypted in connection with a data migration (either in-place or to another location), it may be advantageous to have the tamper-proof module 342 be part of the storage device. Of course, it is also possible to have tamper-proof modules be both part of the storage device and part of one or more of the host(s). In addition, it is also possible to provide the functionality described herein separate or at least partially separate from both the storage device and the host(s).

For both the embodiment described in connection with FIG. 17A and the embodiment described in connection with FIG. 17B (and any other embodiments), the tamper-proof module 342 may be implemented using hardware, software, or a combination thereof that does not allow inspection of data inside the tamper-proof module 342. For example, if the tamper-proof module 342 is implemented using hardware (e.g., a single chip), the hardware may have a self-destruct mechanism that is activated whenever someone tries to open the hardware. The tamper-proof module may be implemented using the S/390 system (z/Architecture) provided by IBM, discussed elsewhere herein.

Figure 18:
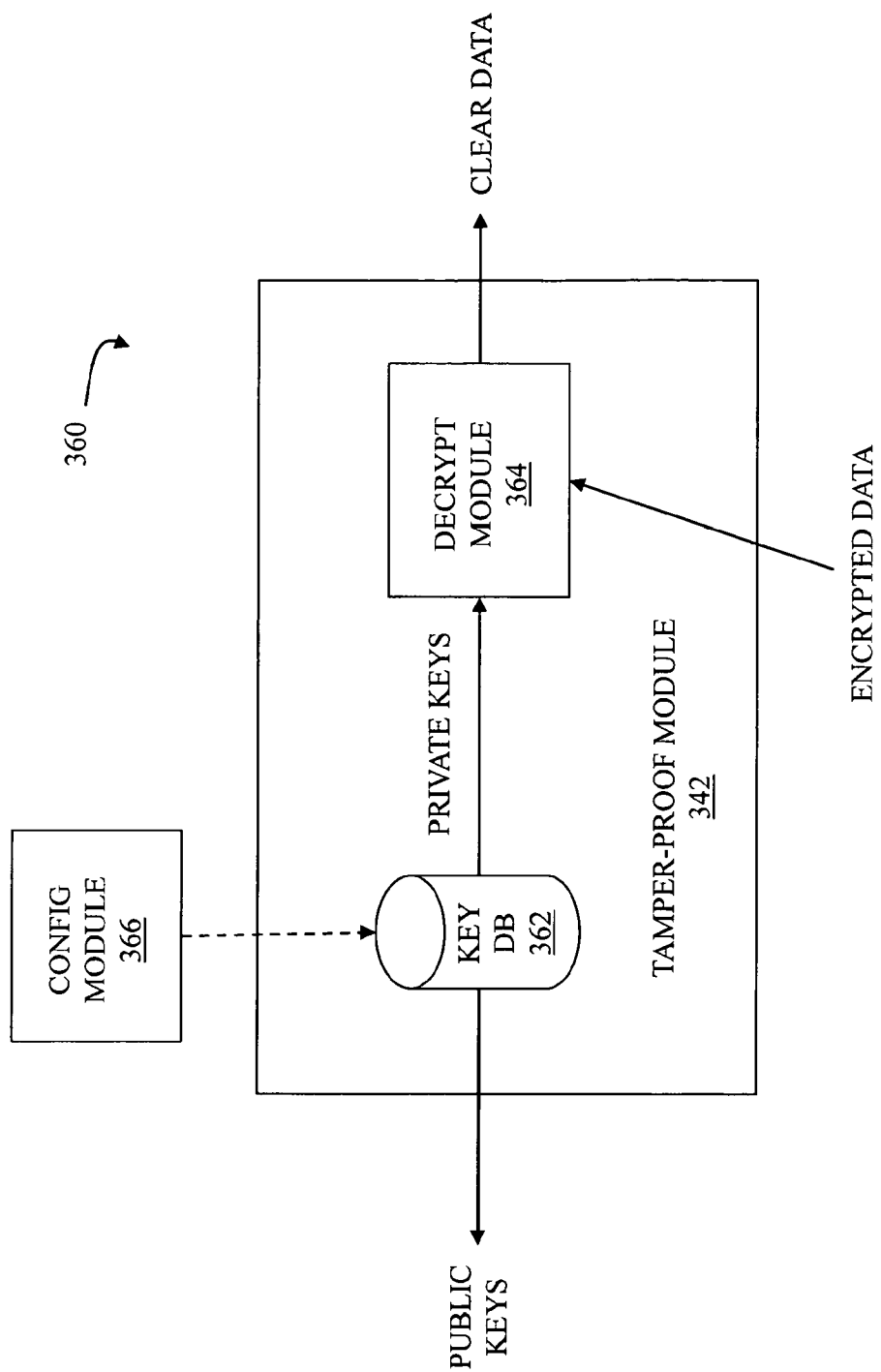
FIG. 18 is a diagram that illustrates components of the tamper proof module according to an embodiment of the system described herein.

Referring to FIG. 18, a diagram 360 illustrates components of the tamper proof module 342. Note that the tamper proof module 342 may be implemented using hardware, software, or any appropriate combination thereof. When the tamper proof module 342 is implemented using software and/or a significant amount of software, the storage device may be configured to only allow certain access to the tamper-proof module 342.

The diagram 360 shows the tamper proof module 342 as including a key database 362 and a decryption module 364. The key database 362 may include all the public keys/private key pairs used for encrypting and decrypting data. The tamper proof module 342 provides, as an output thereto, the public keys (but only the public keys) from the key database 362. As discussed elsewhere herein, the public keys are not secret and are known or knowable by any entity that wishes to encrypt data.

The private keys of the public key/private key pairs stored in the key database 362 are provided to a decryption module 364. The decryption module 364 receives encrypted data from outside the tamper proof module 342 and provides, as an output of the tamper proof module 342, the decrypted data (clear data). In an embodiment herein, no external access is provided to the key data base 362, the decrypt module 364, or any data communication path therebetween. This may be implemented using tamper proof hardware (e.g., a chip) that self-destructs if opened. Alternatively, there may be software/system implementations that prohibit access to the key database 362, the decryption module 364, and/or any data path therebetween.

In some embodiments, a configuration module 366 may be used for providing data to the key database 362. The configuration module 366 may be appropriately secure and accessible only by authorized users. In embodiments that use the configuration module 366, only the configuration module 366 may provide public key/private key pairs to the key database 362. Having such a mechanism prevents a malicious user from providing their own public key/private key pair to the key database 362 in order to gain unauthorized access to data.

Note that with or without the configuration module 366, so long as entities are only allowed to write data to the key database 362 and not read data, it becomes difficult for a legitimately generated public key/private key pair to be compromised.

The system described herein may be implemented in connection with logical data migration where, subsequent to the logical data migration, any reads of the encrypted data (by an authorized user) use the tamper proof module 342 to decrypt the data. Note also that other mechanisms may be used to manage encrypted data. For example, it is possible to have a system where the data is always encrypted whenever written to a storage device and always decrypted whenever read from the storage device so that all of the data stored on the storage system is always encrypted. Such a mechanism may be activated by an optional flag so that a user may select whether to encrypt data or not. Note also that the system described herein may be implemented at any level of code, including microcode of the storage device that reads and writes data. The system may be implemented by intercepting data reads and data writes so that data that is written is encrypted and data that is read (by an authorized user) is decrypted.

The system described herein may be implemented in addition to any other data modification algorithms, including, for example, data compression. The encryption and decryption modules may simultaneously compress the data and/or the data may be compressed by the before or after encryption/decryption. Furthermore, for some implementations, the encryption/decryption may be provided by a user module where the user provides customized modules for encrypting and decrypting data and the system provides hooks for intercepting the data stream on reads and writes (and data migrations) so that the encryption/decryption algorithm is known only to the user that provides his own customized algorithms. In an embodiment herein, the encrypted data is the same size as the decrypted data.

The system described herein may be implemented using "in-place" data migration where data is read from a particular location, encrypted, and then placed back on to the same location. In such a system, a flag (or other appropriate mechanism) may be used to indicate whether each block is encrypted or not. Of course, it is useful if the encrypted data is the same size as the unencrypted data to avoid having to move the data to another location. Note also that a file (or volume) may be accessible while such "in-place" migration is occurring where each block would be decrypted or not depending upon the value of an indicator (e.g., a flag) that indicates whether or not a particular block has been encrypted yet. Once the "in-place" migration is complete, all of the data for the file (or volume) is encrypted so that there may no longer be any need to check the indicator.

For added security, it is possible to require that the public key/private key pairs need to be digitally signed by an authority recognized by the storage device. Thus, a malicious (unauthorized) user that attempts to write its own public key/private key pair to the key database 362 will have difficulty because there may be a mechanism that rejects all public key/private key pairs unless the public key has been digitally singed by a recognized authority (e.g., a PKI CA). In some embodiments, for additional security, the authority may be required to present its own digital certificate and proof that the certificate has not been compromised (i.e., is still valid). Such proof may take the form of a X-509 PKI CRL or any other appropriate mechanism for proving that a digital certificate has not been revoked. In some embodiments, the digital certificate presented by the authority may include the public key that is the portion of the public key/private key pair.

Figure 19:
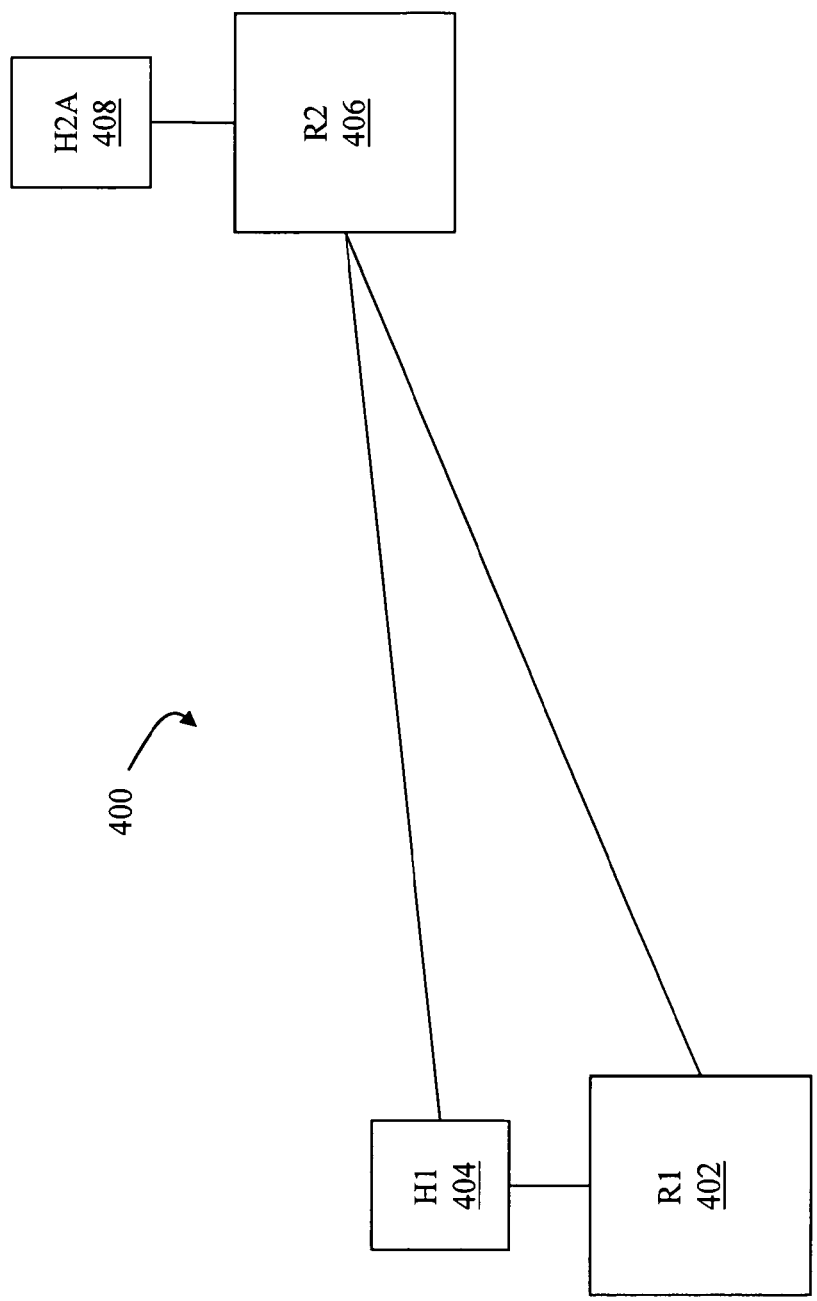
FIG. 19 is a schematic diagram illustrating a local storage device and a remote storage device according to an embodiment of the system described herein.

Referring to FIG. 19, a system 400 is shown as including a local storage device 402 coupled to a local host 404 and a remote storage device 406, coupled to a remote host 408. The local host 404 is also coupled to the remote storage device 406. Work is performed at the local host 404, which accesses the local storage device 402 to store and retrieve data. Data from the local storage device 404 is mirrored to the remote storage device 406 using any appropriate mechanism, such as that provided by the SRDF/S product offered by EMC Corporation of Hopkinton, Mass.

Note that the local storage device 402 is labeled "R1" while the remote storage device 406 is labeled "R2". The designation "R1" may be used for storage devices which exchange data (read and write) with a host while the designation "R2" may be understood to refer to a mirror target. In some embodiments, R2 storage devices may be configured so that a host may only read data from an R2 storage device. For example, for the configuration illustrated by the system 400, the host 408 may read data from the storage device 406, but may not write data thereto. In other embodiments, R2 storage devices may both act as mirror targets and may also behave like R1 devices in some instances. Note that, as described in more detail elsewhere herein, it is possible to have a mixed system so that, for example, the host 404 may read and write to the R2 storage device 406 while the other host 408 may only read data from the storage device 406. Note also that, in instances where hosts are prohibited from writing to R2 devices, a system designer may rely on the R2 being read only for security/compliance purposes. For example, access may be more restricted to the host 408 than it is to the host 404 in instances where data can only be read from the R2 storage devices 406.

Figure 20:
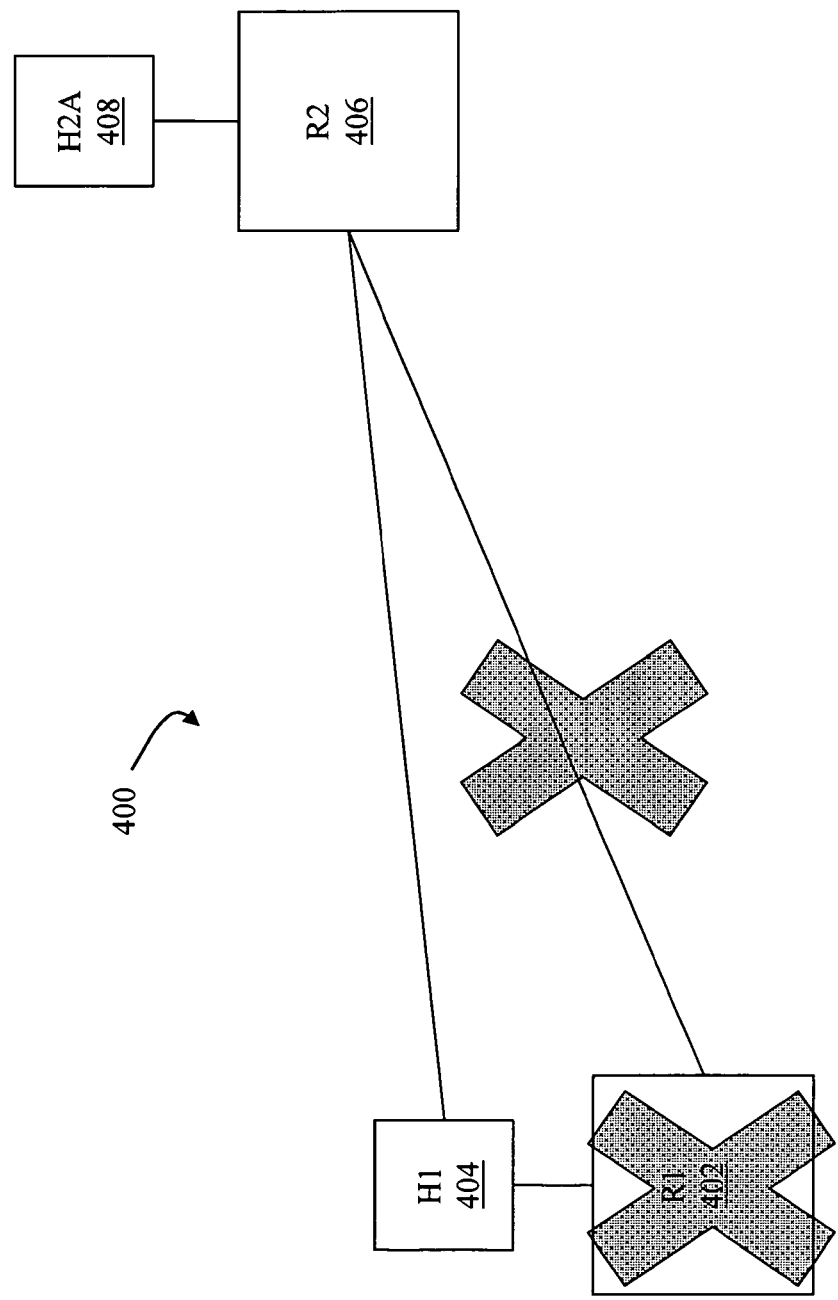
FIG. 20 is a schematic diagram illustrating failover to a remote storage device according to an embodiment of the system described herein.

Referring to FIG. 20, the system 400 is illustrated with a fault at the local site containing the local host 404 and the local storage device 402. Note that it is possible for the fault to be with communication link to the local site as well as, or instead of, with the local storage device 402. When such a failure occurs, the storage device 406 may seamlessly take over for the storage device 402 so that the transition is not noticed by a user. In FIG. 20, the storage device 406 may or may not become an R1 device, depending on the system configuration. However, for the host 404 to continue work using the storage device 406, the storage device 406 becomes writeable.

Although the system 400 has failed over and the storage device 406 has become writeable, it may not be desirable to allow the host 408 to write to the storage device 406. For example, the host 404 may have been part of a relatively secure system for entering modifying data while the host 408 is relatively insecure and had been used to read data only. The system may have relied on the fact that the storage device 406 was an R2 device that would not accept writes. The system described herein addresses the issues presented by this.

Figure 21:
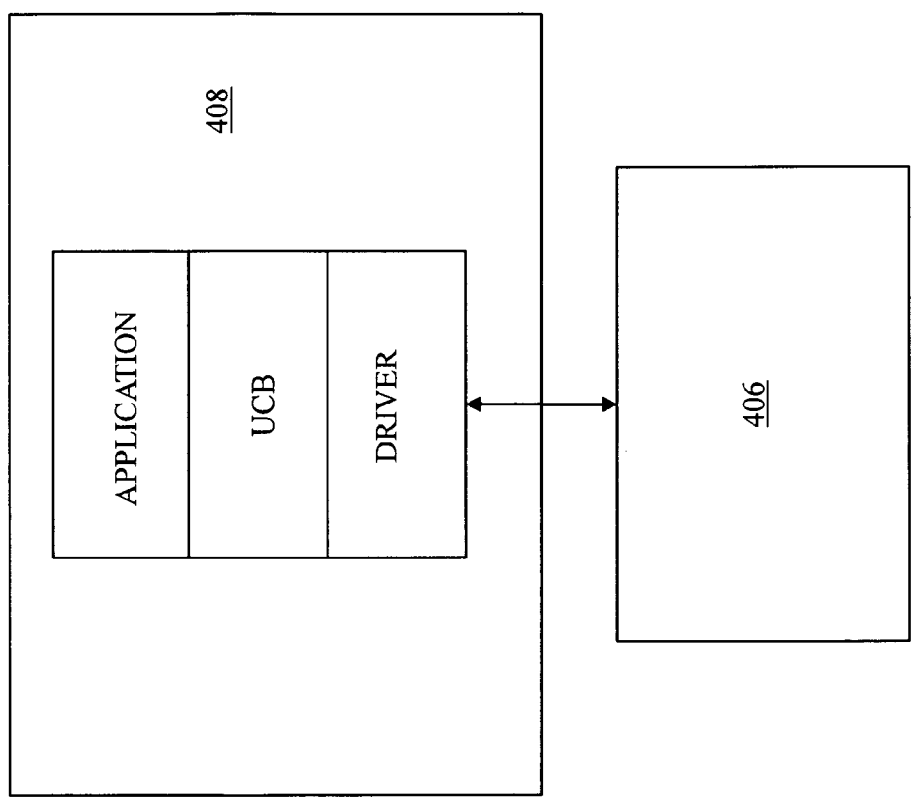
FIG. 21 is a schematic diagram illustrating a host local coupled to a storage device according to an embodiment of the system described herein.

Referring to FIG. 21, the host 408 is shown in more detail coupled to the data storage device 406. As described elsewhere herein, the host 408 may include an application, a UCB, and a driver that communicates with the storage device 406 (e.g., via a subchannel). The system described herein modifies the driver and/or the UCB so that, in instances where it is desirable to prevent the host 408 from writing to the storage device 406, an application on the host 408 that attempts to write to the storage device 406 receives an error message that is effectively identical to the result received when the storage device 406 is configured to be read only. That is, if an application on the host 408 receives a particular result in response to attempting to write to the storage device 406 when the system 400 is in the configuration illustrated by FIG. 19, then the application receives the same result in response to attempting to write to the storage device 406 in the configuration illustrated by FIG. 20 even though the storage device 406 has become writeable. In the first case (FIG. 19), the result may be provided by the storage device 406 and passed through the driver to the application. In the latter case (FIG. 20), the result may be provided directly by the driver to the application without necessarily communicating with the storage device 406. This is described in more detail elsewhere herein.

Figure 22:
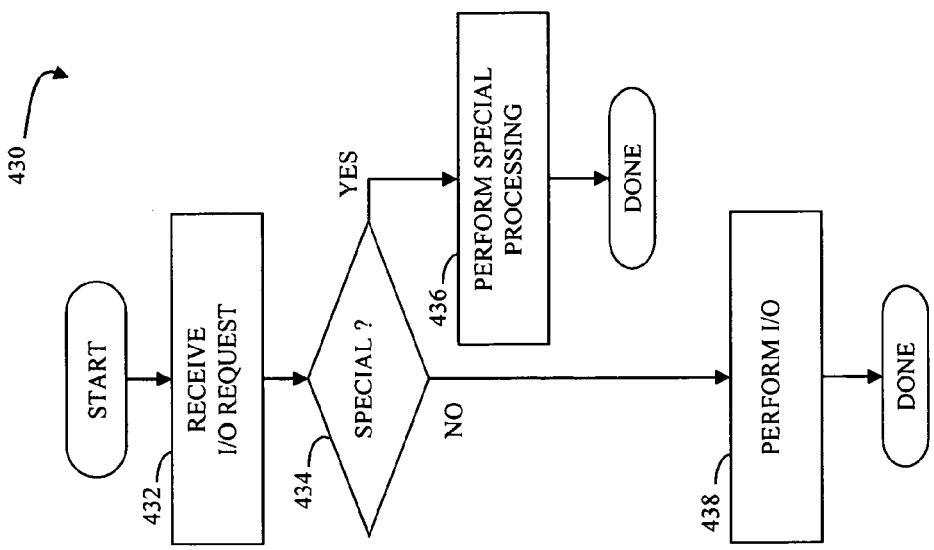
FIG. 22 is a flow chart illustrating processing performed in connection with handling I/O requests according to an embodiment of the system described herein.

Referring to FIG. 22, a flow chart 430 illustrates steps performed to provide the functionality described above in connection with FIG. 21 where a host application is prevented from writing data to the storage device 406 even though the storage device 406 has become writeable. The processing illustrated by the flow chart 430 may be performed by a driver for all hosts/applications that access the storage device 406. Alternatively, the processing may be performed selectively. For example, the processing may be performed for accesses by the host 408 (i.e., by a driver within the host 408), but not for accesses by the host 404. The processing illustrated by the flow chart 430 may also be selectively performed for specific applications and/or groups of applications, specific R1/R2 group(s), etc.

Note that, although the system described herein is illustrated using a driver on the host, the processing performed in connection with the flow chart 430 may be provided by another portion of the host (e.g., an API called by the application). In addition, the processing may be performed by a device different from the host, such as another processing device, provided that the device is separate from the storage device. Similarly, all or some of the application processing may be provided on the other device separate from the host.

Processing begins at a first step 432 where the driver receives an I/O request. Following the step 432 is a test step 434 where it is determined if there is to be any special I/O processing (e.g., inhibiting writes even though the storage device permits writes). In some embodiments, special I/O processing may always be performed (e.g., all applications on a host are prevented from writing). In other instances, the test performed at the step 434 is based on selective criteria, such as the application making the call, the particular R1/R2 group, etc. If it is determined at the step 434 that special processing is to be performed, then control passes from the test step 434 to a step 436 where the special I/O processing is performed. The processing at the step 436 is described in more detail elsewhere herein. Following the step 436, processing is complete. If it is determined at the step 434 that special processing is not to be performed, then control transfers from the test step 434 to a step 438 where the I/O is performed in a usual fashion (i.e., without regard to any special processing). Following the step 438, processing is complete.

Figure 23:
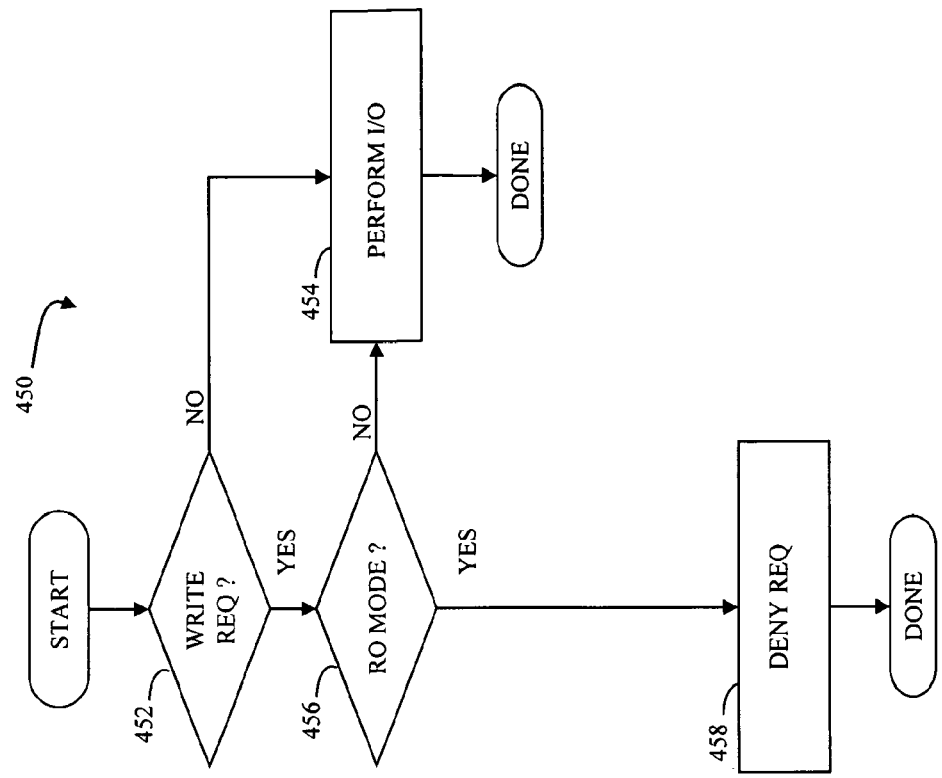
FIG. 23 is a flow chart illustrating processing perform in connection with simulating storage device read only functionality according to an embodiment of the system described herein.

Referring to FIG. 23, a flow chart 450 illustrates in more detail the special I/O processing provided at the step 436 of the flow chart 430 of FIG. 22, discussed above. Processing begins at a first step 452 where it is determined if the I/O request (received at the step 432, discussed above) is a write request. If not, then control transfers from the step 452 to a step 454 where the I/O is performed in a usual fashion (i.e., without regard to any special processing). Following the step 454, processing is complete.

If it is determined at the test step 452 that the I/O request is a write request, then control transfers from the test step 452 to a test step 456 where it is determined if the system is simulating read-only mode. As discussed elsewhere herein, the storage device to which the write request is being directed allows both reads and writes, but a mechanism provided in the host (e.g., a driver) simulates the storage device being read-only. The test at the step 456 determines if the particular I/O operation should be subject to the read-only restriction. As discussed elsewhere herein, it is possible to simulate the storage device being read only for the entire host storage device, for specific R1/R2 groups, for specific applications, etc.

If it determined at the test step 456 that the I/O operation should not be subject to the read only simulation, then control transfers from the test step 456 to the step 454, discussed above, where the I/O operation is performed. Otherwise, control transfers from the step 456 to a step 458 where the write request is denied. In an embodiment herein, the calling routine (i.e., the application that performed the write operation) receives a response similar (or identical) to the response received by the calling routine if no special processing is performed but the storage device is actually read only. That is, the calling routine receives the response/status that would be received using the prior art with the storage device set to be read only. Following the step 458, processing is complete.

Note that the system described herein may be used with any number and/or configuration of R1 and R2 devices, the different configurations and failover scenarios described, for example, in U.S. Pat. No. 7,647,525 titled RESUMPTION OF OPERATIONS FOLLOWING FAILOVER IN CONNECTION WITH TRIANGULAR ASYNCHRONOUS REPLICATION (the '525 patent), which is incorporated by reference herein. In the event of a failure at the local site and/or links thereto, operations may resume at either of the remote sites using one of the remote storage devices.

Note that the system may be used in connection with planned failovers as well as unplanned failovers. Furthermore, although RDF has been used to illustrate the system herein, the system is not restricted to being used only with RDF. Furthermore, the system may be applied at the host level as illustrated herein, the application level (i.e., different applications on the same host either read and write data or are restricted to read only), different portions of an application, and/or on any appropriate processing unit.

The system described herein may be used to shift processing from the storage device to the host (or other device) for processing other than simulating read only access. For example, the host may handle data compression, data encryption, data mirroring, storage device status requests, etc. This is explained in detail below.

Referring to FIG. 24, a flow chart 470 illustrates processing performed by a host (or other device) to handle data compression processing that would otherwise be handled by a storage device. The processing illustrated by the flow chart 470 is the special processing performed at the step 438 shown in the flow chart 430, discussed above, and may be provided in the driver (or similar module) so that one or more applications do not need to be modified when the host (or other device) simulates the storage device performing data compression/decompression.

Processing begins at a first test step 472 where it is determined if the I/O operation being handled is a write operation. If so, then control transfers from the test step 472 to a step 474 where the data being written is compressed (using any appropriate compression technique). Following the step 474 is a step 476 where the I/O of the compressed data is performed in a usual fashion (i.e., without regard to any special processing). Following the step 476, processing is complete.

If it is determined at the test step 472 that the I/O operation is not a write (i.e., the I/O operation is a read), then control transfers from the test step 472 to a step 478 where the I/O is performed to read the compressed data from the storage device in a usual fashion (i.e., without regard to any special processing). Following the step 478 is a step 482 where the data is decompressed. Following the step 482, processing is complete. The result of performing the processing illustrated by the flow chart 470 is that the storage device can store compressed data without having to perform the processing necessary to compress and decompress the data and without the application needing to do so either. Thus, the application reads and writes data without regard to whether the storage device is performing the compression/decompression or the storage device functionality is being simulated.

Referring to FIG. 25, a flow chart 490 illustrates processing performed by a host (or other device) to handle data encryption processing that would otherwise be handled by a storage device. The processing illustrated by the flow chart 490 is the special processing performed at the step 438 shown in the flow chart 430, discussed above, and may be provided in the driver (or similar module) so that one or more applications do not need to be modified when the host (or other device) simulates the storage device performing encryption.

Processing begins at a first test step 492 where it is determined if the I/O operation being handled is a write operation. If so, then control transfers from the test step 492 to a step 494 where the data being written is encrypted (using any appropriate encryption technique). Following the step 494 is a step 496 where the I/O of the encrypted data is performed in a usual fashion (i.e., without regard to any special processing). Following the step 496, processing is complete.

If it is determined at the test step 492 that the I/O operation is not a write (i.e., the I/O operation is a read), then control transfers from the test step 492 to a step 498 where the I/O is performed to read the encrypted data from the storage device in a usual fashion (i.e., without regard to any special processing). Following the step 498 is a step 502 where the data is decrypted. Following the step 502, processing is complete. The result of performing the processing illustrated by the flow chart 490 is that the storage device can store encrypted data without having to perform the processing necessary to encrypt and decrypt the data and without the application needing to do so either. Thus, the application reads and writes data without regard to whether the storage device is performing the encryption/decryption or the storage device functionality is being simulated.

Figure 26:
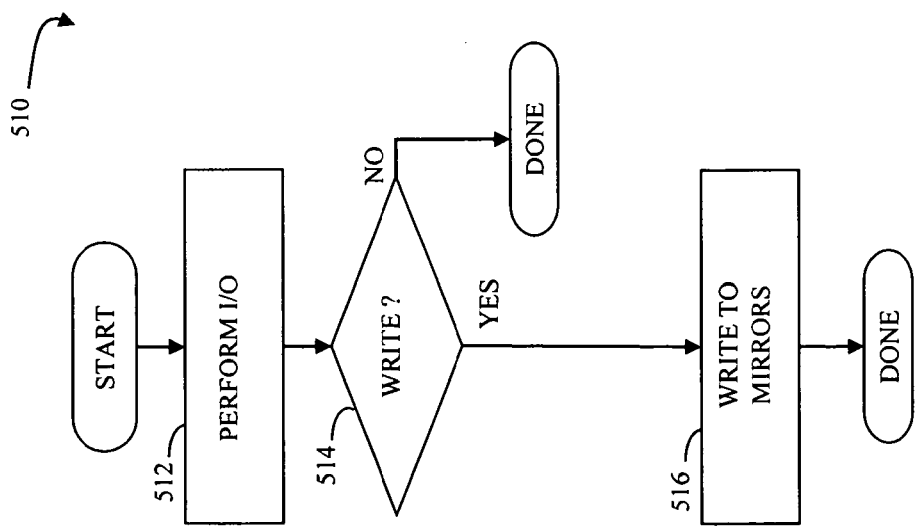
FIG. 26 is a flow chart illustrating processing perform in connection with simulating storage device data mirroring functionality according to an embodiment of the system described herein.

Referring to FIG. 26, a flow chart 510 illustrates steps performed in connection with using the system herein to provide data mirroring at the host (or other device) instead of at the storage device. Processing begins at a first step 512 where the I/O is performed in a usual fashion (i.e., without regard to any special processing). Following the step 512 is a test step 514 where it is determined if a write operation is being performed. If not, then processing is complete. Otherwise, control transfers from the test step 514 to a step 516 where the data written at the step 512 is written to the mirrors. Following the step 516, processing is complete.

Figure 27:
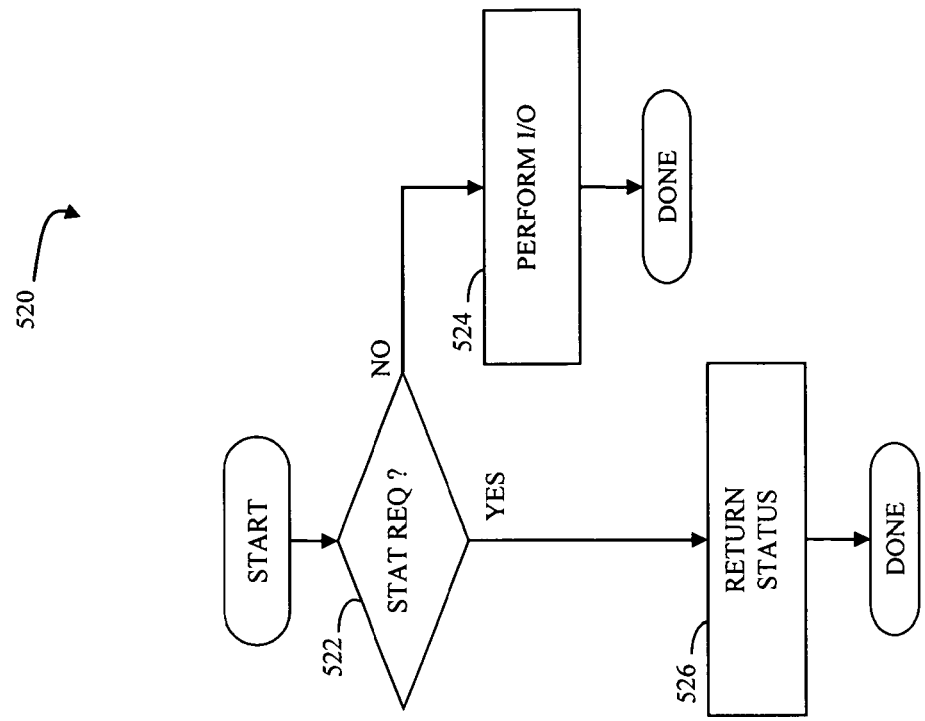
FIG. 27 is a flow chart illustrating processing perform in connection with simulating storage device status functionality according to an embodiment of the system described herein.

Referring to FIG. 27, a flow chart 520 illustrates steps performed in connection with using the system herein to service status requests at the host (or other device) instead of at the storage device. Processing begins at a first test step 522 where it is determined if a status request is being performed. If not, then control transfers from the test step 522 to a step 524 where the I/O is performed in a usual fashion (i.e., without regard to any special processing). Following the step 524, processing is complete. If it is determined at the test step 522 that a status request is being performed, then control transfers from the test step 522 to a step 526 where the host (or other device) returns the status of the storage device. Following the step 526, processing is complete.

Note that, in some instances, the order of steps in the flowcharts may be modified, where appropriate. The system described herein may be implemented using the hardware described herein, variations thereof, or any other appropriate hardware capable of providing the functionality described herein. It is possible to implement the system described herein to provide more than one of the functionalities discussed herein, and/or additional functionalities, concurrently. The system described herein includes computer software, in a non-transitory computer readable medium, that executes any of the steps described herein.

While the invention has been disclosed in connection with various embodiments, modifications thereon will be readily apparent to those skilled in the art. Accordingly, the spirit and scope of the invention is set forth in the following claims.

The invention claimed is:

1. A method of simulating storage device functionality, comprising:
    providing a device coupled to the storage device, wherein the device is separate from the storage device;
    having the device handle I/O requests between an application and the storage device; and
    in response to the application issuing an I/O request, having the device receive the I/O request, and determine, based on a selective criteria input to the device, if servicing of the I/O request is subject to a simulation mode; and
    when, based on the selective criteria input, the device determines that the I/O request is to be serviced in the simulation mode, having the device provide functionality that would otherwise be handled by the storage device to respond to the I/O request, wherein the device simulates the functionality of the storage device to provide the functionality instead of the storage device, and wherein the device inhibits performance of the actual functionality of the storage device even though the storage device permits the functionality.

2. A method, according to claim 1, wherein the device is a host computer.

3. A method, according to claim 2, wherein the application runs on the host computer.

4. A method, according to claim 3, wherein a driver on the host computer provides the functionality.

5. A method, according to claim 1, wherein the functionality includes at least one of: read only functionality, data compression, data encryption, mirroring, and status reporting.

6. A method, according to claim 5, wherein, for each particular functionality provided by the device, the device returns to the application a response corresponding to a response provided by the storage device in connection with the storage device providing the particular functionality.

7. Computer software that simulates functionality of a storage device, the software being provided in a non-transitory computer readable medium of a device that is separate from the storage device, the software comprising:
    executable code that handles I/O requests between an application and the storage device;
    executable code that receives an I/O request from the application;
    executable code that determines, based on a selective criteria input to the device, if servicing of the I/O request is subject to a simulation mode; and
    executable code for simulating functionality that, when a determination is made based on the selective criteria input that the I/O request is to be serviced in the simulation mode, provides the particular functionality that would otherwise be handled by the storage device to respond to the I/O request, wherein the executable code for simulating functionality simulates the particular functionality of the storage device to provide the particular functionality instead of the storage device, and wherein the executable code for simulating functionality inhibits performance of the actual functionality of the storage device even though the storage device permits the functionality.

8. Computer software, according to claim 7, wherein the device is a host computer.

9. Computer software, according to claim 8, wherein the application runs on the host computer.

10. Computer software, according to claim 9, wherein a driver on the host computer provides the functionality.

11. Computer software, according to claim 7, wherein the functionality includes at least one of: read only functionality, data compression, data encryption, mirroring, and status reporting.

12. Computer software, according to claim 11, further comprising:
    executable code that returns to the application a response corresponding to a response provided by the storage device in connection with the storage device providing the particular functionality.

13. Computer software, according to claim 7, wherein the selective criteria input is received at the device from a source external to the storage device.

14. Computer software, according to claim 13, wherein source external to the storage device is the application, and wherein the application issues the selective criteria input to the device to determine whether or not the I/O request is serviced in the simulation mode.

15. A method, according to claim 1, wherein the selective criteria input is received at the device from a source external to the storage device.

16. A method, according to claim 15, wherein source external to the storage device is the application, and wherein the application issues the selective criteria input to the device to determine whether or not to determine whether or not the I/O request is serviced in the simulation mode.

* * * * *